(12) United States Patent
Lu

(10) Patent No.: US 11,984,194 B2
(45) Date of Patent: May 14, 2024

(54) LAYOUT OF DELAY CIRCUIT UNIT, LAYOUT OF DELAY CIRCUIT, AND SEMICONDUCTOR MEMORY

(71) Applicant: CHANGXIN MEMORY TECHNOLOGIES, INC., Hefei (CN)

(72) Inventor: Meixiang Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 170 days.

(21) Appl. No.: 17/728,054

(22) Filed: Apr. 25, 2022

(65) Prior Publication Data
US 2023/0267980 A1 Aug. 24, 2023

(30) Foreign Application Priority Data
Feb. 24, 2022 (CN) .......................... 202210171878.6

(51) Int. Cl.
G11C 7/20 (2006.01)
G11C 7/22 (2006.01)

(52) U.S. Cl.
CPC ................... G11C 7/222 (2013.01)

(58) Field of Classification Search
CPC ... G11C 7/222; G11C 7/1066; H01L 27/0207; H03K 3/00; H10B 99/00; G06F 30/392; H03L 7/085
See application file for complete search history.

(56) References Cited

U.S. PATENT DOCUMENTS 5,834,960 A 11/1998 Heima
2016/0105122 A1 4/2016 Gong et al.
2016/0105166 A1* 4/2016 Seo ............ H03K 5/12 327/399
2018/0198439 A1* 7/2018 Hsu ............ H03K 5/131
2018/0314771 A1 11/2018 Lee et al.
2020/0212052 A1 7/2020 Lin et al.

FOREIGN PATENT DOCUMENTS

| CN | 105515556 A | 4/2016 |
| TW | I659607 B | 5/2019 |
| TW | I667736 B | 8/2019 |
| TW | I749443 B | 12/2021 |

OTHER PUBLICATIONS

First Office Action of the Taiwanese application No. 111125898, dated Mar. 16, 2023, 6 pgs.

* cited by examiner

*Primary Examiner* — Xiaochun L Chen
(74) *Attorney, Agent, or Firm* — Cooper Legal Group, LLC

(57) ABSTRACT

A layout of a delay circuit unit, a layout of a delay circuit, and a semiconductor memory are provided. The layout of the delay circuit unit includes multiple layout units arranged in an array and each forming a NOT-AND (NAND) gate circuit; here several layout units conforming to a first layout pattern are sequentially arranged in a first row of the array; and several layout units conforming to a second layout pattern are sequentially arranged in a second row of the array; here the first layout pattern is different from the second layout pattern, and the first layout pattern and the second layout pattern are such that the first row and the second row form a center-symmetrical structure.

18 Claims, 17 Drawing Sheets

First row:

Second row:

LAYOUT OF DELAY CIRCUIT UNIT, LAYOUT OF DELAY CIRCUIT, AND SEMICONDUCTOR MEMORY

CROSS-REFERENCE TO RELATED APPLICATION

This application is based upon and claims the benefit of priority to Chinese Patent Application No. 202210171878.6, filed on Feb. 24, 2022, the contents of which are incorporated herein by reference in their entirety for all purposes.

BACKGROUND

A semiconductor device (e.g., a semiconductor memory, a controller for controlling the semiconductor memory, or the like) transmits output data using a clock signal (e.g., a data strobe signal (DQS)) synchronized with the output data.

The semiconductor device may adjust a phase of the clock signal to a desired value and output data in synchronization with the clock signal. For example, in a Delay Locked Loop (DLL), the DLL outputs a clock signal having a desired phase by a delay time adjustment operation and outputs data in synchronization with the clock signal. A Coarse Delay Adjustment Circuit (CDL) in the DLL delays a reference clock signal through multiple delay stages to output two phase signals having a delay stage phase difference.

SUMMARY

The disclosure provides a layout of a delay circuit unit, a layout of a delay circuit, and a semiconductor memory.

Technical solutions of the disclosure are implemented as follows.

According to a first aspect, an embodiment of the disclosure provides a layout of a delay circuit unit, including multiple layout units arranged in an array and each forming a NOT-AND (NAND) gate circuit. Here, several of the multiple layout units conforming to a first layout pattern are sequentially arranged in a first row of the array. Here, several of the multiple layout units conforming to a second layout pattern are sequentially arranged in a second row of the array. Here, the first layout pattern is different from the second layout pattern, and the first layout pattern and the second layout pattern are such that the first row and the second row form a center-symmetrical structure.

According to a second aspect, an embodiment of the disclosure provides a layout of a delay circuit. The delay circuit includes N delay circuit units, N is an integer greater than zero, each delay circuit unit comprises a plurality of layout units each of which forms a NOT-AND (NAND) gate circuit, the plurality of layout units being arranged in an array, wherein several of the plurality of layout units conforming to a first layout pattern are sequentially arranged in a first row of the array; and several of the plurality of layout units conforming to a second layout pattern are sequentially arranged in a second row of the array, wherein the first layout pattern is different from the second layout pattern, and the first layout pattern and the second layout pattern are such that the first row and the second row form a center-symmetrical structure.

According to a third aspect, an embodiment of the disclosure provides a semiconductor memory, comprising a delay circuit, wherein the delay circuit comprises N delay circuit units, N is an integer greater than zero, each delay circuit unit comprises a plurality of layout units each of which forms a NOT-AND (NAND) gate circuit, the plurality of layout units being arranged in an array, wherein several of the plurality of layout units conforming to a first layout pattern are sequentially arranged in a first row of the array; and several of the plurality of layout units conforming to a second layout pattern are sequentially arranged in a second row of the array, wherein the first layout pattern is different from the second layout pattern, and the first layout pattern and the second layout pattern are such that the first row and the second row form a center-symmetrical structure.

DETAILED DESCRIPTION

Figure 1:
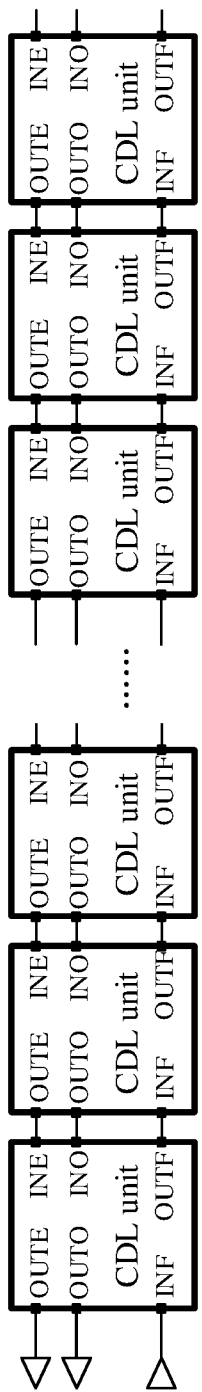
FIG. 1 is a schematic structural diagram of a composition of a delay circuit according to an embodiment of the disclosure.

The technical solutions in the embodiments of the disclosure will be clearly and completely described below with reference to the accompanying drawings in the embodiments of the disclosure. It will be appreciated that the specific embodiments described herein are intended only to explain related disclosure and not intended to limit the disclosure. Furthermore, it is to be noted that for the sake of convenient description, only the parts related to the related disclosure are shown in the drawings.

Unless defined otherwise, all technical and scientific terms used herein have the same meaning as those generally understood by those skilled in the art belonging to the disclosure. The terms used herein are intended only to describe embodiments of the disclosure only and not intended to limit the disclosure.

In the following description, "some embodiments" is referred, which describe a subset of all possible embodiments, however, it may be understood that "some embodiments" may be the same or different subsets of all possible embodiments and may be combined with each other without conflict.

It is to be noted that the term "first\second\third" referred in the embodiments of the disclosure is intended only to distinguish similar objects and does not represent a specific ranking for the objects, and it may be understood that "first\second\third" may interchange a specific order or successive order where allowable, to enable the embodiments of the disclosure described herein to be implemented in an order other than that illustrated or described herein.

A semiconductor device transmits output data using a clock signal synchronized with the output data, may adjust a phase of the clock signal to a desired value and output data in synchronization with the clock signal. For example, in a DLL, the DLL outputs a clock signal having a desired phase by a delay time adjustment operation and outputs data in synchronization with the clock signal. Here a CDL (or coarse delay circuit) in the DLL delays a reference clock signal by multiple delay stages to output two phase signals having a delay stage phase difference.

An embodiment of the disclosure provides a layout of a delay circuit unit, including multiple layout units arranged in an array and each forming a NAND gate circuit; here several of the multiple layout units conforming to a first layout pattern are sequentially arranged in a first row of the array; and several of the multiple layout units conforming to a second layout pattern are sequentially arranged in a second row of the array; here the first layout pattern is different from the second layout pattern, and the first layout pattern and the second layout pattern are such that the first row and the second row form a center-symmetrical structure. In this way, not only it is advantageous to achieve delay consistency between different phase signals, but also the layout of the delay circuit unit is compactly arranged as a whole, so that an area of the layout may also be saved.

Embodiments of the disclosure will be described in detail below with reference to the accompanying drawings.

Referring to FIG. 1, there is shown a schematic structural diagram of a composition of a delay circuit according to an embodiment of the disclosure, the delay circuit may be a coarse delay circuit in a DLL. As shown in FIG. 1, the delay circuit includes multiple delay circuit units (in case of the coarse delay circuit, the delay circuit unit is CDL unit), and for each CDL unit, a first input interface signal (INF signal) is input from left side of the CDL unit, a second input interface signal (INE signal) and a third input interface signal (INO signal) are input from right side of the CDL unit, and through delay processing of the CDL unit, a first output interface signal (OUTF signal) is obtained and output from the right side of the CDL unit, and a second output interface signal (OUTE signal) and a third output interface signal (OUTO signal) are obtained and output from the left side of the CDL unit.

That is, for each CDL unit in the delay circuit shown in FIG. 1, as seen from right to left, the INE signal and the INO signal are input signals, and the OUTE signal and the OUTO signal obtained by the delay processing are output signals; for two adjacent CDL units, the OUTE signal output from the right CDL unit is the INE signal input into the left CDL unit, and the OUTO signal output from the right CDL unit is the INO signal input into the left CDL unit. As seen from left to right, the INF signal is an input signal, and the OUTF signal obtained by the delay processing is an output signal; for two adjacent CDL units, the OUTF signal output from the left CDL unit is the INF signal input into the right CDL unit; in this way, multiple CDL units are cascaded to form a delay circuit which implements delay processing of a signal by cooperation of the multiple CDL units.

Figure 2:
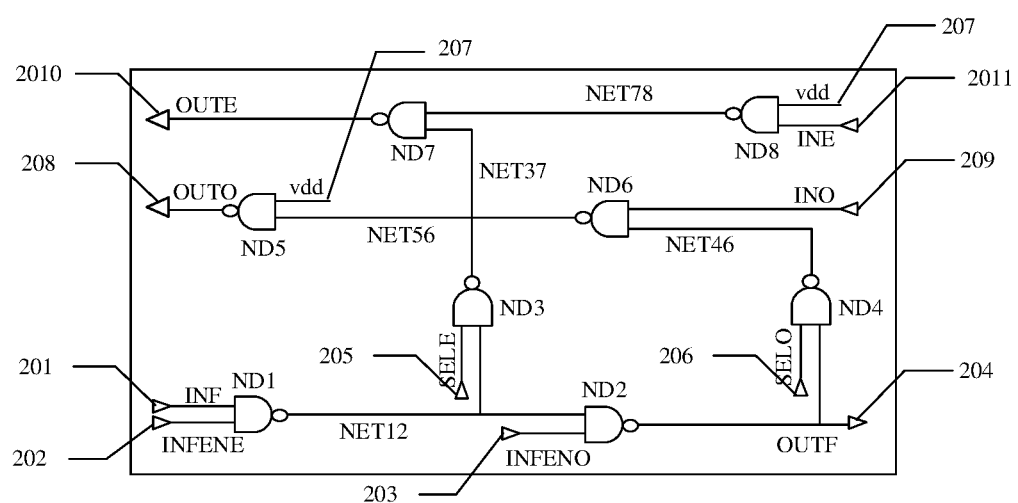
FIG. 2 is a schematic structural diagram of a circuit of a delay circuit unit according to an embodiment of the disclosure.

For each CDL unit, referring to FIG. 2, there is shown a schematic structural diagram of a circuit of a delay circuit unit according to an embodiment of the disclosure. As shown in FIG. 2, each CDL unit may include eight NAND gate circuits: a first NAND gate circuit ND1, a second NAND gate circuit ND2, a third NAND gate circuit ND3, a fourth NAND gate circuit ND4, a fifth NAND gate circuit ND5, a sixth NAND gate circuit ND6, a seventh NAND gate circuit ND7, and an eighth NAND gate circuit ND8.

As shown in FIG. 2, each NAND gate circuit in the CDL unit includes two input terminals and one output terminal.

With respect to the first NAND gate circuit ND1, two input terminals are connected to a first input interface 201 and a first NAND gate input interface 202 respectively, and two input signals are a first input interface signal (INF signal) from the first input interface 201 and a first NAND gate input signal (INFENE signal) from the first NAND gate input interface 202 respectively; an output signal of the first NAND gate circuit ND1 is a first NAND gate output signal (NET12 signal), and an output terminal of the first NAND gate circuit ND1 is connected to an input terminal of the second NAND gate circuit ND2 and an input terminal of the third NAND gate circuit ND3 respectively.

With respect to the second NAND gate ND2, two input terminals are connected to the output terminal of the first NAND gate circuit ND1 and a second NAND gate input interface 203 respectively, and two input signals are the first NAND gate output signal (NET12 signal) from the first NAND gate circuit ND1 and a second NAND gate input signal (INFENO signal) respectively; an output signal of the second NAND gate circuit ND2 is a first output interface signal (OUTF signal), and an output terminal of the second NAND gate circuit ND2 is connected to an input terminal of the fourth NAND gate circuit ND4 and a first output interface 204 respectively.

With respect to the third NAND gate circuit ND3, two input terminals are connected to a third NAND gate input interface 205 and the output terminal of the first NAND gate circuit ND1 respectively, and two input signals are a third NAND gate input signal (SELE signal) from the third NAND gate input interface 205 and the first NAND gate output signal (NET12 signal) from the first NAND gate circuit ND1 respectively; an output signal of the third NAND gate circuit ND3 is a third NAND gate output signal (NET37 signal), and an output terminal of the third NAND gate circuit ND3 is connected to an input terminal of the seventh NAND gate circuit ND7.

With respect to the fourth NAND gate ND4, two input terminals are connected to a fourth NAND gate input interface 206 and the output terminal of the second NAND gate circuit ND2 respectively, and two input signals are a fourth NAND gate input signal (SELO signal) from the fourth NAND gate input interface 206 and the first output interface signal (OUTF signal) respectively; an output signal of the fourth NAND gate circuit ND4 is a fourth NAND gate output signal (NET46 signal), and an output terminal of the fourth NAND gate circuit ND4 is connected to an input terminal of the sixth NAND gate circuit ND6.

With respect to the fifth NAND gate ND5, two input terminals are connected to a power supply terminal 207 and an output terminal of the sixth NAND gate circuit ND6 respectively, and two input signals are a power supply signal (vdd signal) from the power supply terminal 207 and a sixth NAND gate output signal (NET56 signal) respectively; an output signal of the fifth NAND gate circuit ND5 is a third output interface signal (OUTO signal), and an output terminal of the fifth NAND gate circuit ND5 is connected to a third output interface 208.

With respect to the sixth NAND gate ND6, two input terminals are connected to a third input interface 209 and the output terminal of the fourth NAND gate circuit ND4 respectively, and two input signals are a third input interface signal (INO signal) from the third input interface 209 and the fourth NAND gate output signal (NET46 signal) respectively; an output signal of the sixth NAND gate circuit ND6 is the sixth NAND gate output signal (NET56 signal), and an output terminal of the sixth NAND gate circuit ND6 is connected to an input terminal of the fifth NAND gate circuit ND5.

With respect to the seventh NAND gate ND7, two input terminals are connected to the output terminal of the third NAND gate circuit ND3 and an output terminal of the eighth NAND gate circuit ND8 respectively, and two input signals are the third NAND gate output signal (NET37 signal) and an eighth NAND gate output signal (NET78 signal) respectively; an output signal of the seventh NAND gate circuit ND7 is a second output interface signal (OUTE signal), and an output terminal of the seventh NAND gate circuit ND7 is connected to a second output interface 2010.

With respect to the eighth NAND gate circuit ND8, two input terminals are connected to the power supply terminal 207 and a second input interface 2011 respectively, and two input signals are the power supply signal (vdd signal) and a second input interface signal (INE signal) respectively; an output signal of the eighth NAND gate circuit ND8 is the eighth NAND gate output signal (NET78 signal), and an output terminal of the eighth NAND gate circuit ND8 is connected to an input terminal of the seventh NAND gate circuit ND7.

It is to be noted that the abovementioned letters only represent abbreviation for the signals, and do not form a specific limitation on types of the signals. In practice, the signals may also be described in other ways, which is not specifically limited in the embodiments of the disclosure.

Furthermore, it is to be noted that the first input interface signal (INF signal) is input to the CDL unit, then passes through the first NAND gate circuit ND1, the third NAND gate circuit ND3, and the seventh NAND gate circuit ND7, and is subjected to delay processing together with other signals, to obtain the second output interface signal (OUTE signal); or, the first input interface signal (INF signal) is input to the CDL unit, then passes through the first NAND gate circuit ND1, the second NAND gate circuit ND2, the fourth NAND gate circuit ND4, the sixth NAND gate circuit ND6, and the fifth NAND gate circuit ND5, and is subjected to delay processing together with other signals, to obtain the third output interface signal (OUTO signal). That is, with respect to the first input interface signal (INF signal), two signal lines INF-OUTE and INF-OUTO are formed inside the CDL unit, here the signal line INF-OUTE passes through three NAND gate circuits to delay process the signal, and the signal line INF-OUTO passes through five NAND gate circuits to delay process the signal. Therefore, the second output interface signal (OUTE signal) and the third output interface signal (OUTO signal) have a difference of two NAND gate circuit delay times, that is, two clock cycles, at the time of output.

In this way, the delay processing of the signal is achieved by cooperation of the eight NAND gate circuits. However, as can be seen from FIG. 2, due to influence of disordered distribution of the NAND gate circuits, routing arrangement of the lines, or the like, it is difficult to ensure output delay of the second output interface signal (OUTE signal) and the third output interface signal (OUTO signal) to have the difference of two NAND gate circuit delay times; furthermore, when the output signal of the NAND gate circuit is transmitted to the next NAND gate circuit, length of the path through which the signal passes may be different, and layout of the whole circuit is not neat, thereby affecting delay consistency between signals, which is not beneficial to delay operation of the CDL unit and the delay circuit.

In a delay circuit (e.g., DLL) design, since each delay stage requires the same time delay, a layout design having the same time delay is very important. In a current layout design, it is difficult to ensure that the time delay of each delay stage is the same. Therefore, based on this, embodiments of the disclosure design specific arrangement of CDL units to improve delay inconsistency during signal transmission while increasing integration level of the circuit.

Figure 3:
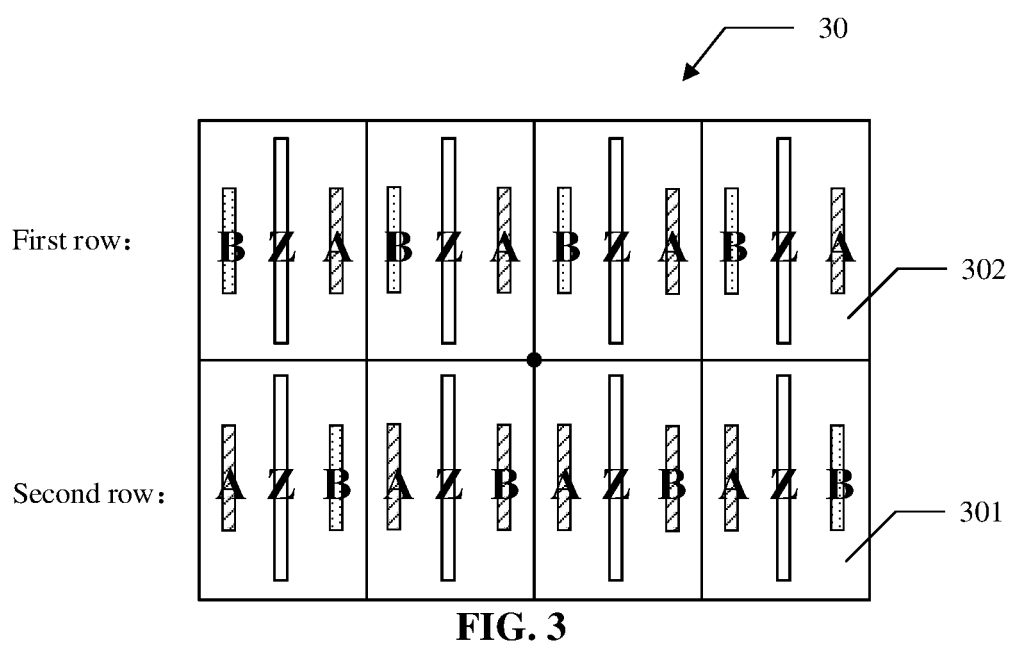
FIG. 3 is a schematic structural diagram of a composition of a layout of a delay circuit unit according to an embodiment of the disclosure.

In an embodiment of the disclosure, referring to FIG. 3, there is shown a schematic structural diagram of a composition of a layout 30 of a delay circuit unit according to an embodiment of the disclosure. As shown in FIG. 3, the layout 30 includes multiple layout units arranged in an array and each forming a NAND gate circuit.

Here, several layout units 301 of the multiple layout units conforming to a first layout pattern are sequentially arranged in a first row of the array.

Several layout units 302 of the multiple layout units conforming to a second layout pattern are sequentially arranged in a second row of the array.

Here, the first layout pattern is different from the second layout pattern, and the first layout pattern and the second layout pattern are such that the first row and the second row form a center-symmetrical structure.

It is to be noted that FIG. 3 shows a structure of layout corresponding to a delay circuit unit in the delay circuit. The delay circuit is formed by cascading several delay circuit units, and may be a coarse delay circuit in the DLL or another type of delay circuit, which is not specifically limited in the embodiment of the disclosure.

The layout 30 shown in FIG. 3 includes multiple layout units each forming a corresponding NAND gate circuit. Here the multiple layout units are arranged in an array, that is, in the delay circuit unit, multiple NAND gate circuits formed by the multiple layout units are arranged in an array.

As shown in FIG. 3, the array composed of the multiple layout units (since each of the multiple layout units form a NAND gate circuit, the array may also be referred to as an array composed of multiple NAND gate circuits) includes at least a first row and a second row, layout units arranged in the first row are represented as layout units 301 and layout units arranged in the second row are represented as layout units 302 since the layout units of the first row and the second row have different layout patterns; here several layout units 301 in the first row have a layout pattern conforming to the first layout pattern; several layout units 302 in the second row have a layout pattern conforming to the second layout pattern, and the first layout pattern and the second layout pattern are different layout patterns.

Based on different layout patterns of two rows of the array, the first row and the second row of the array are formed a center-symmetrical structure, here a center-symmetrical point is a geometric center of the layout 30, specifically as shown by a black dot in FIG. 3. In this way, the layout of the delay circuit unit is compactly arranged as a whole, so that an area of the layout may also be saved.

With respect to the first layout pattern and the second layout pattern, as shown in FIG. 3, in some embodiments, each of the multiple layout units may include at least a first input signal line A, a second input signal line B, and an output signal line Z.

Here, according to the first layout pattern, the signal lines of each of the layout units 301 are arranged in a sequence of the second input signal line B, the output signal line Z, and the first input signal line A from right to left.

According to the second layout pattern, the signal lines of each of the layout units 302 are arranged in a sequence of the first input signal line A, the output signal line Z, and the second input signal line B from right to left.

It is to be noted that as shown in FIG. 3, with respect to the NAND gate circuit formed by each of the layout units in the layout 30, each of the layout units includes the first input signal line A, the second input signal line B, and the output signal line Z, and as seen from left to right or from right to left, the three signal lines in each of the layout units 301 of the first row and the three signal lines in each of the layout units 302 of the second row are arranged in a reversed order, thereby forming a center-symmetrical structure between the two rows.

That is, two input terminals (i.e., the first input signal line A and the second input signal line B) and one output terminal (i.e., the output signal line Z) corresponding to each NAND gate circuit formed by each of the layout units are mainly shown in FIG. 3.

Figure 4:
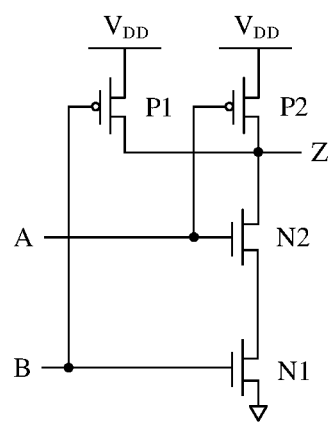
FIG. 4 is a schematic circuit structural diagram of a NAND gate circuit according to an embodiment of the disclosure.

Furthermore, with respect to each NAND gate circuit formed in the layout 30, referring to FIG. 4, there is shown a schematic circuit structural diagram of a NAND gate circuit according to an embodiment of the disclosure. As shown in FIG. 4, in some embodiments, the NAND gate circuit may include a first PMOS transistor P1, a second PMOS transistor P2, a first NMOS transistor N1, and a second NMOS transistor N2.

It is to be noted that as shown in FIG. 4, with respect to any NAND gate circuit in the embodiment of the disclosure, the NAND gate circuit may be composed of two PMOS transistors P1 and P2 and two NMOS transistors N1 and N2. Here A represents a first input signal line, B represents a second input signal line, Z represents an output signal line, two PMOS transistors (i.e., the first PMOS transistor P1 and the second PMOS transistor P2) are connected in parallel, and two NMOS transistors (i.e., the first NMOS transistor N1 and the second NMOS transistor N2) are connected in series.

In some embodiments, the layout 30 may be at least partitioned into a first metal layer and a second metal layer located above the first metal layer.

Here, the first metal layer is provided for arranging the first input signal line, the second input signal line, the output signal line, and first layer signal lines.

The second metal layer is provided for arranging second layer signal lines.

Here, each of the first input signal line, the second input signal line, the output signal line, and the first layer signal lines is routed along a first direction, each of the second layer signal lines is routed along a second direction, and the first direction and the second direction form an included angle of 90 degrees.

It is to be noted that the layout 30 according to the embodiment of the disclosure may be at least partitioned into the first metal layer (also referred to as Metal 0) and the second metal layer (also referred to as Metal 1) located on the upper layer of the first metal layer.

Here the first input signal line, the second input signal line, and the output signal line in the layout unit are arranged in the first metal layer, and the first metal layer is further arranged with the first layer signal lines; the second metal layer is arranged with the second layer signal lines. Each of the first input signal line, the second input signal line, the output signal line, and the first layer signal lines is routed along the first direction, and each of the second layer signal lines is routed along the second direction, and the first direction and the second direction form an included angle of 90 degrees.

Figure 5:
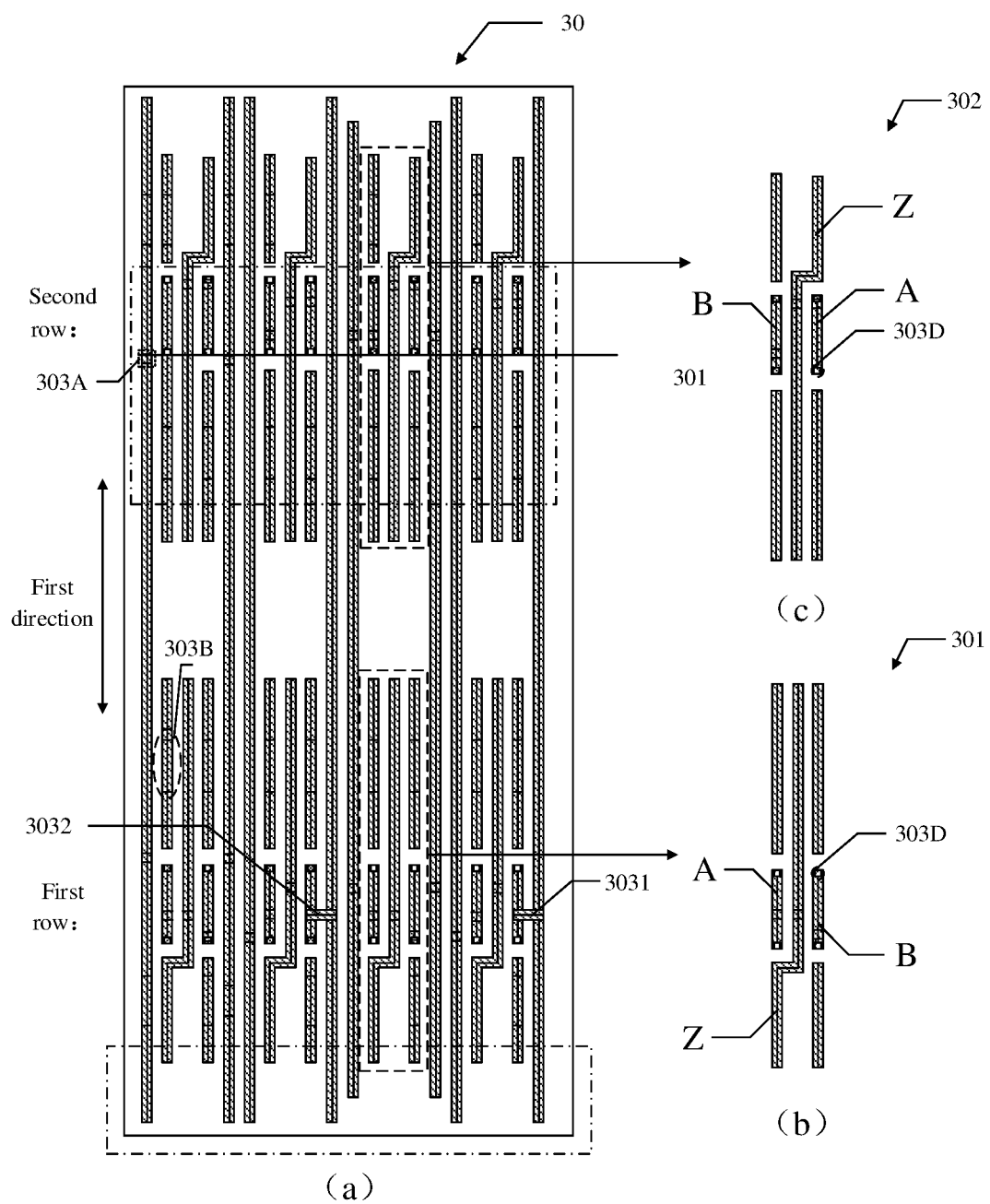
FIG. 5 is a schematic structural diagram of details of a layout of a delay circuit unit according to an embodiment of the disclosure.

With respect to first metal layer, referring to FIG. 5, there is shown a schematic structural diagram of details of a layout 30 of a delay circuit unit according to an embodiment of the disclosure. Here (a) of FIG. 5 is a schematic diagram showing the whole routing arrangement of the first metal layer; (b) of FIG. 5 is a schematic diagram showing the routing arrangement of the signal lines in the NAND gate circuit corresponding to the layout unit 301 arranged in the first row of the first metal layer in the first layout pattern; (c) of FIG. 5 is a schematic diagram showing the routing arrangement of the signal lines in the NAND gate circuit corresponding to the layout unit 302 arranged in the second row of the first metal layer in the second layout pattern.

As shown in FIG. 5, in the routing of the first metal layer, other lines except the signal lines of the NAND gate circuits included in (b) and (c) are referred to as first layer signal lines.

Figure 6:
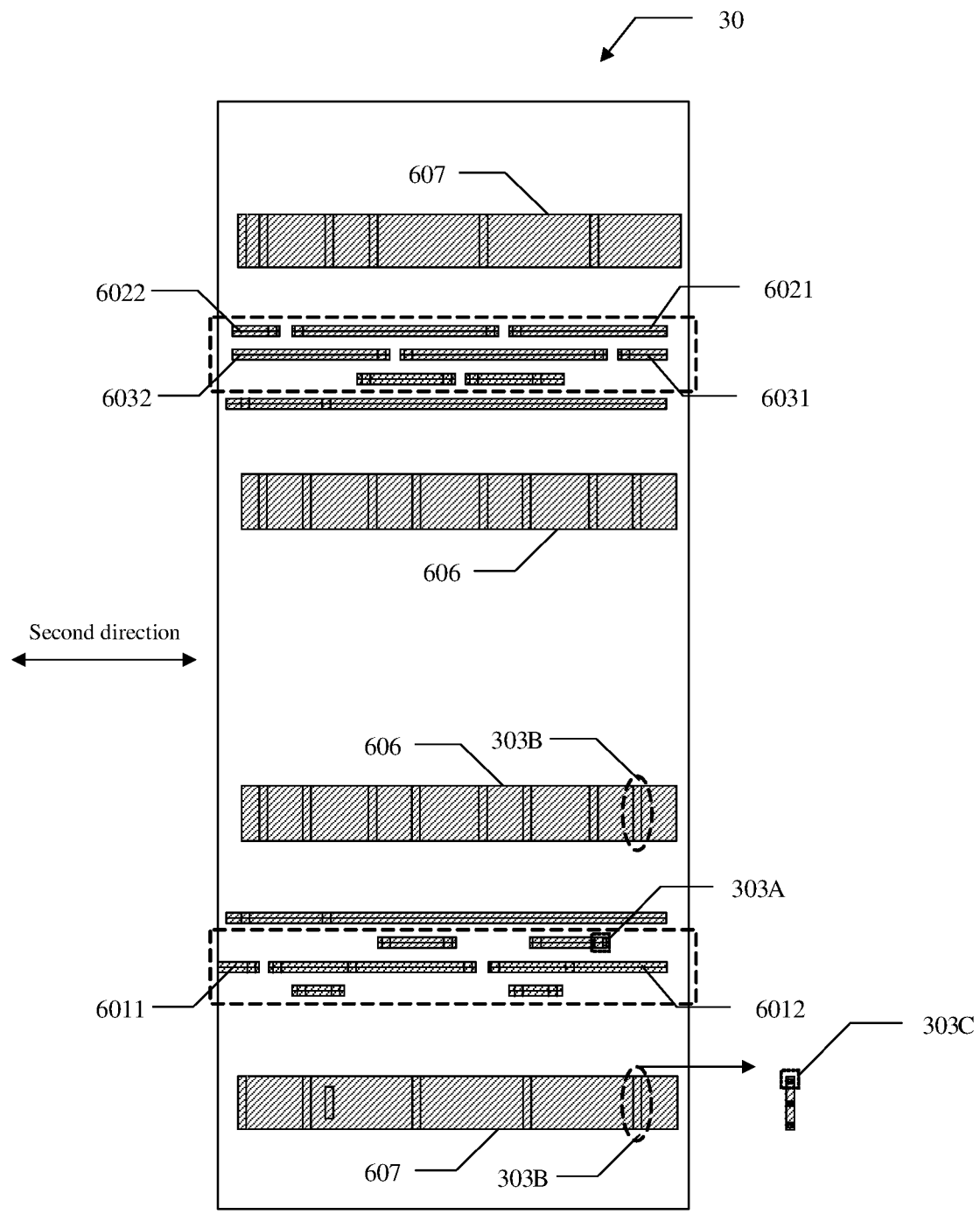
FIG. 6 is a schematic structural diagram of details of a layout of another delay circuit unit according to an embodiment of the disclosure.

With respect to second metal layer, referring to FIG. 6, there is shown a schematic structural diagram of details of a layout 30 of another delay circuit unit according to an embodiment of the disclosure, it is a schematic diagram showing the whole routing arrangement of the second metal layer. As shown in FIG. 6, the metal lines inside the frame with dotted lines represent second layer signal lines extending along the second direction.

It is to be noted that as shown in FIGS. 5 and 6, the first layer signal lines and the signal lines of the NAND gate circuit in the first metal layer extend along the first direction; the second layer signal lines in the second metal layer extend along the second direction, and the first direction and the second direction form an included angle of 90 degrees. Since the second metal layer is located on the upper layer of the first metal layer, the second layer signal lines may cross over the first metal layer to connect non-adjacent signal lines in the first metal layer, thereby achieving signal transmission.

Furthermore, in some embodiments, as shown in FIG. 6, the second metal layer may further include a power supply line 606 and a ground line 607.

Here, the power supply line 606 is connected to a source of the first PMOS transistor and a source of the second PMOS transistor respectively.

The ground line 607 is connected to a source of the first NMOS transistor.

The first input signal line A is connected to a gate of the second PMOS transistor and a gate of the second NMOS transistor respectively.

The second input signal line B is connected to a gate of the first PMOS transistor and a gate of the first NMOS transistor respectively.

The output signal line Z is connected to a drain of the first PMOS transistor, a drain of the second PMOS transistor, and a drain of the second NMOS transistor respectively.

It is to be noted that as shown in FIG. 6, the second metal layer further includes two power supply lines 606 and two ground lines 607, each of the power supply lines 606 and the ground lines 607 may be provided with connection points 303B, and each of the connection points 303B may include multiple contact points 303C. For example, in FIG. 6, each of the connection points 303B includes three contact points 303C, and a specific number of contact points is not specifically limited in the embodiment of the disclosure. Accordingly, as shown in FIG. 5, the signal line of the first metal layer is provided with connection points 303B at positions and in a number corresponding to those in the second metal layer. Here the connection points 303B in the first metal layer and the connection points 303B in the second metal layer may be connected by a contact plug, and each of the contact points 303C included therein may be a contact hole.

Specifically, with respect to each NAND gate circuit, the power supply line 606 may be connected to a source of the first PMOS transistor P1 and a source of the second PMOS transistor P2 respectively through the connection points 303B; the ground line 607 may be connected to a source of the first NMOS transistor N1 the connection points 303B.

Figure 7:
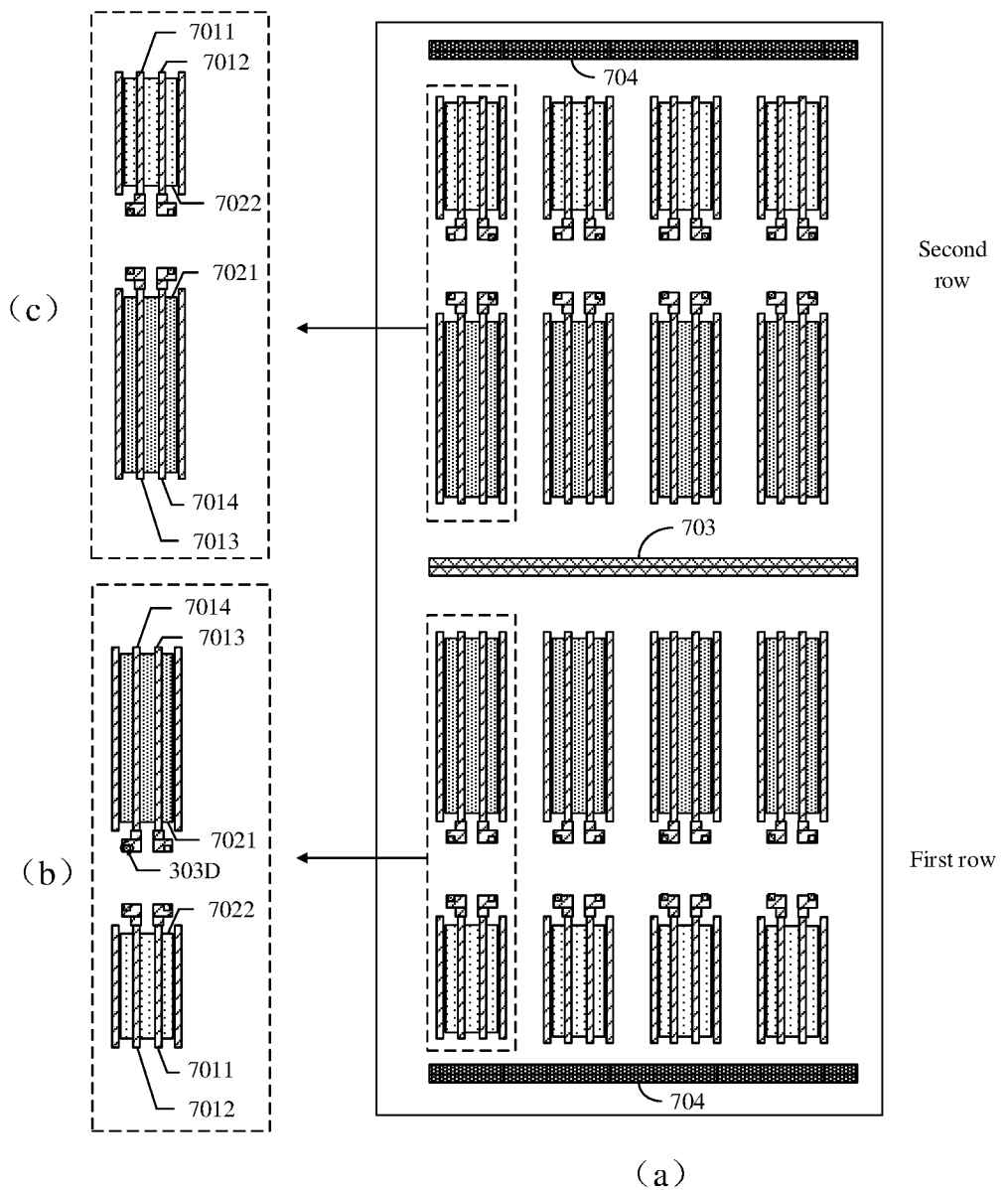
FIG. 7 is a schematic structural diagram of a layout of a gate-source layer according to an embodiment of the disclosure.

It is also to be noted that the layout 30 may further include a gate-source layer providing gates and active regions of transistors (including NMOS and PMOS transistors) in the NAND gate circuit. Referring to FIG. 7, there is shown a schematic structural diagram of a layout of a gate-source layer according to an embodiment of the disclosure. As shown in (a) of FIG. 7, the gate-source layer is arranged with active regions and gates of multiple transistors, and may further include a first isolation structure 703 and a second isolation structure 704. Here the first isolation structure 703 may isolate NAND gate circuits and transistors of the first row from NAND gate circuits and transistors of the second row, to avoid mutual crosstalk; the second isolation structure 704 may isolate NAND gate circuits and transistors shown in the figure from other structures in the circuit (for example, layout of adjacent delay circuit units), to avoid adverse effects caused by mutual crosstalk between the circuits. Here the first isolation structure 703 may be an N-well region, and the second isolation structure 704 may be a P-well region.

Active regions and gates corresponding to four NAND gate circuits arranged in the first layout pattern are sequentially arranged in a first row of the gate-source layer from left to right. (b) of FIG. 7 shows active regions and gates corresponding to the NAND gate circuits arranged in the first layout pattern. As shown in (b) of FIG. 7, the active region 7022 may represent an active region of the first NMOS transistor N1 and an active region of the second NMOS transistor N2, and may be an N-doped active region; the active region 7021 may represent an active region of the first PMOS transistor P1 and an active region of the second PMOS transistor P2, and may be a P-doped active region; the gate 7011 may represent a gate of the first NMOS transistor N1, the gate 7012 may represent a gate of the second NMOS transistor N2, the gate 7013 may represent a gate of the first PMOS transistor P1, and the gate 7014 may represent a gate of the second PMOS transistor P2.

Each gate may be provided with connection points 303D. Accordingly, as shown in FIG. 5, each of the first input signal lines A and B in the first metal layer is also provided with connection points 303D at corresponding positions and in a corresponding number, so that the gates and respective input signal lines may be connected through the connection points 303D.

Specifically, for each NAND gate circuit formed in the layout unit, the first input signal line A is connected to the gate of the second PMOS transistor P2 and the gate of the second NMOS transistor P2 respectively through the connection points 303D; the second input signal line B is connected to the gate of the first PMOS transistor P1 and the gate of the first NMOS transistor N1 respectively through the connection points 303D.

Figure 8:
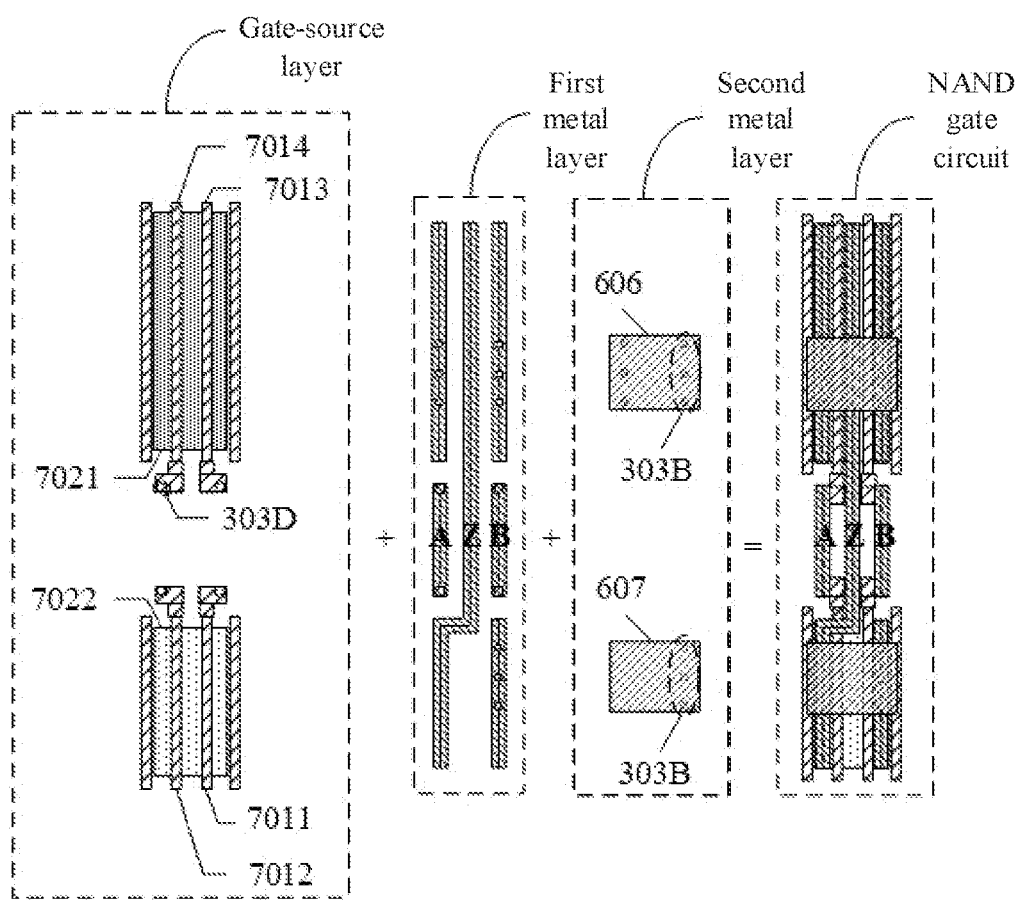
FIG. 8 is a schematic structural diagram of a composition of a layout unit according to an embodiment of the disclosure.

Referring to FIG. 8, there is shown a schematic structural diagram of a composition of a layout unit according to an embodiment of the disclosure. As shown in FIG. 8, there is shown a schematic diagram of superimposed connection of a layout unit 301 in the first row of the layout 30. FIG. 8 corresponds to the schematic circuit structural diagram of the NAND gate circuit in FIG. 4. Here the gate-source layer, the first metal layer, and the second metal layer are sequentially superimposed and connected according to the connection points at corresponding positions, the first metal layer is located on an upper layer of the gate-source layer and the second metal layer is located above the first metal layer; a lower end of the first input signal line A is connected to the gate 7012 of the second NMOS transistor N2 through the connection points 303D, and an upper end of the first input signal line A is connected to the gate 7014 of the second PMOS transistor P2 through the connection points 303D; a lower end of the second input signal line B is connected to the gate 7014 of the first NMOS transistor N1 through the connection points 303D, and an upper end of the second input signal line B is connected to the gate 7013 of the first PMOS transistor P1 through the connection points 303D; the output signal line Z is connected to a drain of the first PMOS transistor, a drain of the second PMOS transistor, and a drain of a second N-type transistor (not shown in the figure) respectively; the power supply line 606 is connected to the gate 7013 of the first PMOS transistor and the gate 7014 of the second PMOS transistor respectively through the connection points 303B; the ground line 607 is connected to the gate 7011 of the first NMOS transistor through the connection points 303B.

Furthermore, as shown in FIG. 7 or FIG. 8, two redundant signal lines (dummy) are arranged on both sides of the gates 7011 and 7012 and on both sides of the gates 7013 and 7014, to maintain neat symmetry of the layout, ensure manufacturability of the chip, improve accuracy in the process, and avoid etching failure.

That is, in the layout of the delay circuit unit according to the embodiment of the disclosure, the gate-source layer, the first metal layer, and the second metal layer may be sequentially included from a lower layer to an upper layer. Taking a layout unit corresponding to a NAND gate circuit as an example, as shown in FIGS. 4 and 8, the gate-source layer forms a gate and an active region of a transistor; the first metal layer forms the first input signal line A, the second input signal line B, and the output signal line Z; the second metal layer forms the power supply line and the ground line. The gate-source layer, the first metal layer, and the second metal layer are superimposed on each other, and connected through the connection points at corresponding positions to form the NAND gate circuit.

Furthermore, (c) of FIG. 7 shows a schematic arrangement diagram of the gate and the active region of the NAND gate circuit corresponding to the layout unit 302 arranged in the second row of the layout 30 in the second layout pattern, and is distributed in a center-symmetrical manner with (b) of FIG. 7, and has the same connection as (b) of FIG. 7, which is not elaborated here.

With respect to the first layer signal lines and the second layer signal lines, in some embodiments, the first layer signal lines may include at least a first signal line 3021, a second signal line 3022, a third signal line 3023, a fourth signal line 3024, a fifth signal line 3025, and a sixth signal line 3026; and the second layer signal lines may include at least a first input interface signal line 6011, a first output interface signal line 6012, a second input interface signal line 6021, a second output interface signal line 6022, a third input interface signal line 6031, and a third output interface signal line 6032.

Figure 9:
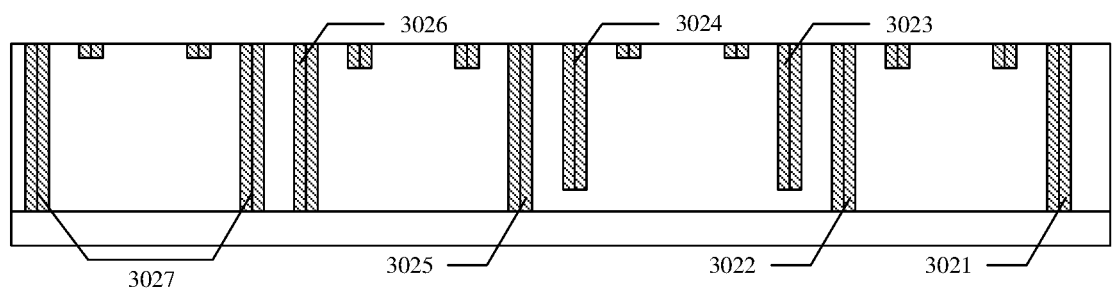
FIG. 9 is a partially enlarged schematic diagram of a layout of a delay circuit unit according to an embodiment of the disclosure.

It is to be noted that referring to FIG. 9, there is shown a partially enlarged schematic diagram of a layout 30 of a delay circuit unit according to an embodiment of the disclosure, it is a partially enlarged schematic diagram of a first metal layer, that is, a frame with dash-dotted lines in a lower part of FIG. 5.

As shown in FIG. 9, the first signal line in the first metal layer may include at least six types of signal lines as follows: the first signal line 3021, the second signal line 3022, the third signal line 3023, the fourth signal line 3024, the fifth signal line 3025, and the sixth signal line 3026.

Here, the first signal line 3021 transmits a first signal, the second signal line 3022 transmits a second signal, the third signal line 3023 transmits a third signal, the fourth signal line 3024 transmits a fourth signal, the fifth signal line 3025 transmits a fifth signal, and the sixth signal line 3026 transmits a sixth signal. The first signal, the second signal, the third signal, the fourth signal, the fifth signal, and the sixth signal are different signals.

Here, the first signal may be the foregoing fourth NAND gate input signal (SELO signal), the second signal may be the foregoing second NAND gate input signal (INFENO signal), the third signal may be the foregoing fourth NAND gate output signal (NET46 signal), the fourth signal may be the foregoing third NAND gate output signal (NET37 signal), the fifth signal may be the foregoing third NAND gate input signal (SELE signal), and the sixth signal may be the foregoing first NAND gate input signal (INFENE signal).

Here, the SELO signal and the SELE signal correspond to two selection signals with different phases, the INFENO signal and the INFENE signal correspond to two enable signals of an input clock signal, and the NET37 signal and the NET46 signal correspond to internal node signals of the delay circuit unit.

It is also to be noted that the second layer signal lines in the second metal layer may include at least the first input interface signal line 6011, the first output interface signal line 6012, the second input interface signal line 6021, the second output interface signal line 6022, the third input interface signal line 6031, and the third output interface signal line 6032.

Here, the first input interface signal line 6011 transmits a first input interface signal (INF signal), the first output interface signal line 6012 transmits a first output interface signal (OUTF signal), the second input interface signal line 6021 transmits a second input interface signal (INE signal), the second output interface signal line 6022 transmits a second output interface signal (OUTE signal), the third input interface signal line 6031 transmits a third input interface signal (INO signal), and the third output interface signal line 6032 transmits a third output interface signal (OUTO signal).

In some embodiments, the first layer signal lines may be arranged on both sides of each of the multiple layout units.

Here, the first layer signal lines are arranged in a sequence of the first signal line 3021, the second signal line 3022, the third signal line 3023, the fourth signal line 3024, the fifth signal line 3025, and the sixth signal line 3026 from right to left.

Figure 10:
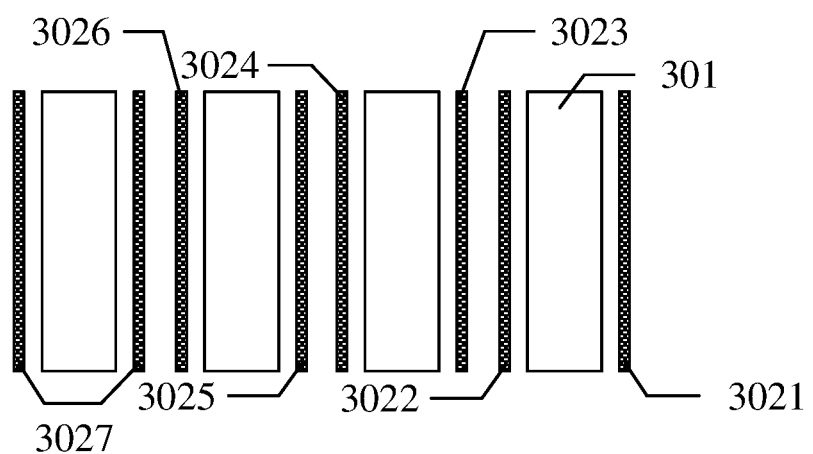
FIG. 10 is a simplified schematic structural diagram of a layout of a delay circuit unit according to an embodiment of the disclosure.

It is to be noted that referring to FIG. 10, there is shown a simplified schematic structural diagram of a layout 30 of a delay circuit unit according to an embodiment of the disclosure, it may represent a simplified amplification of a first row in an array shown by a first metal layer, and may also represent a simplified amplification of a second row. As shown in FIGS. 5, 9 and 10, first layer signal lines are arranged on left and right sides of each of the layout units respectively, and the first layer signal lines on the left and right sides are the same for two upper and lower layout units. The first layer signal lines in the first metal layer are arranged in a sequence of the first signal line 3021, the second signal line 3022, the third signal line 3023, the fourth signal line 3024, the fifth signal line 3025, and the sixth signal line 3026 from right to left.

Furthermore, in some embodiments, the first layer signal lines may further include multiple redundant signal lines 3027.

Here, the first layer signal lines are arranged in a sequence of the first signal line 3021, the second signal line 3022, the third signal line 3023, the fourth signal line 3024, the fifth signal line 3025, the sixth signal line 3026, and the multiple redundant signal lines 3027 from right to left.

It is to be noted that as shown in FIGS. 5, 9 and 10, the first layer signal lines in the first metal layer may further include multiple redundant signal lines 3027, here each of the multiple redundant signal lines 3027 does not transmit a signal. Furthermore, referring to FIG. 6, the first and third connection points 303B from left to right in the ground line 607 connect the respective redundant signal lines 3027 to the ground line. Here only two redundant signal lines 3027 and two connection points 303B connecting the respective redundant signal lines to the ground line are shown, and in practice, the number of redundant signal lines may be set according to process requirements, which is not specifically limited in the embodiment of the disclosure.

The redundant signal lines 3027 may ensure neat arrangement of the layout as a whole, and may ensure manufacturability of the circuit in the manufacturing process, prevent etching failure due to excessive or insufficient exposure, and avoid influence of reflection and diffraction of light on the accuracy of physical patterns of key components in the photolithography process.

In some embodiments, multiple first layer signal lines in the first metal layer may have a same width and a same spacing between two adjacent signal lines.

Figure 11:
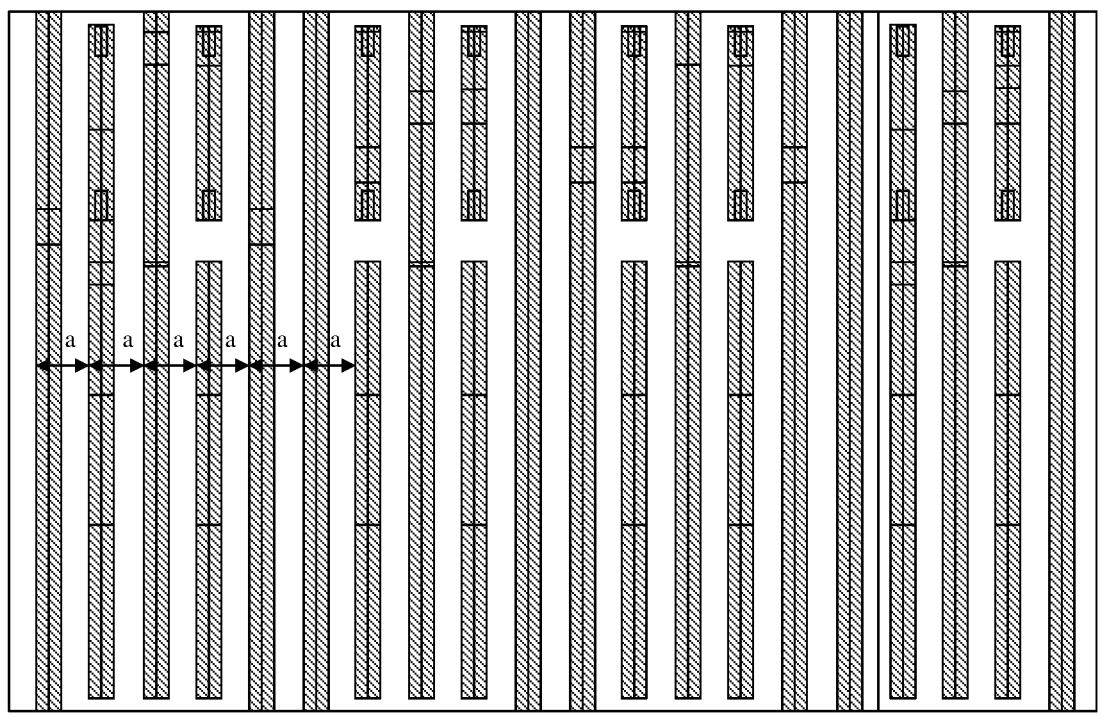
FIG. 11 is a partially enlarged schematic diagram of a layout of another delay circuit unit according to an embodiment of the disclosure.

It is to be noted that referring to FIG. 11, there is shown a partially enlarged schematic diagram of a layout 30 of another delay circuit unit according to an embodiment of the disclosure, it is a partially enlarged schematic diagram of a first metal layer, that is, a frame with dash-dotted lines in an upper part of FIG. 5. As shown in FIG. 11, with respect to the signal lines (including the first layer signal lines and the signal lines of the NAND gate circuit) in the first metal layer, each signal line may have a same width, and a same spacing exists between any two adjacent signal lines, and in FIG. 11, a sum of the width of each signal line and the spacing between two adjacent signal lines is a.

In this way, in the first metal layer, the same spacing and signal line width are maintained between the first layer metal lines and the signal lines of the NAND gate circuit, so that not only it is advantageous to maintain delay consistency between different signals during transmission, but also neat layout of the whole circuit is maintained, so that the circuit is compactly arranged, and an area of the layout is saved.

In some embodiments, the second layer signal lines may further include multiple intermediate connection lines, each intermediate connection line is provided with a connection point.

Here, the multiple intermediate connection lines connect signal lines provided with connection points in the first metal layer, to transmit a target signal to a corresponding NAND gate circuit of the layout unit.

It is to be noted that as shown in FIG. 5, each of the layout units and the first layer signal lines in the first metal layer is provided with connection points 303A; as shown in FIG. 6, each of the second layer signal lines in the second metal layer is also provided with connection points 303A. Here the second layer signal lines except the foregoing first input interface signal line 6011, first output interface signal line 6012, second input interface signal line 6021, second output interface signal line 6022, third input interface signal line 6031, and third output interface signal line 6032 in the frame with dotted lines of FIG. 6 are referred to as intermediate connection lines.

Based on the connection points 303A provided on the signal lines of the first metal layer and the second metal layer, the signal lines of the first metal layer and the signal lines of the second metal layer may be connected to achieve signal transmission.

Figure 12:
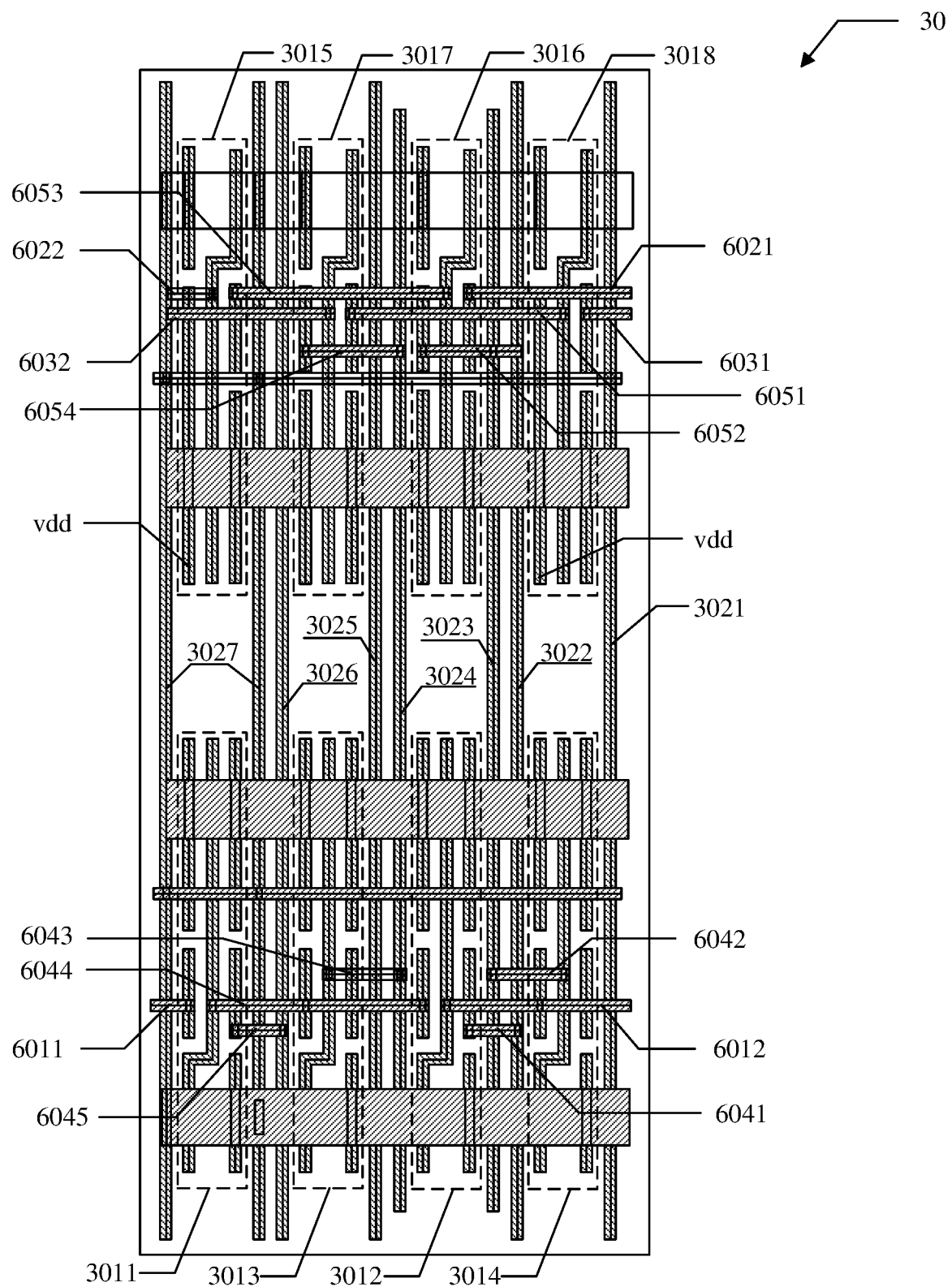
FIG. 12 is a schematic structural diagram of details of a layout of yet another delay circuit unit according to an embodiment of the disclosure.
Figure 13:
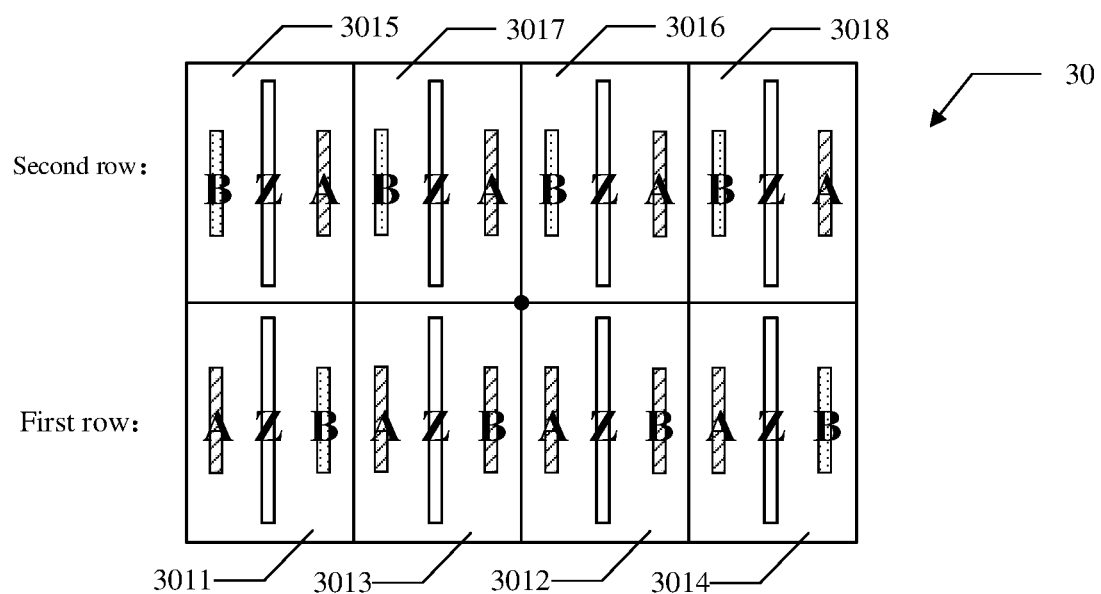
FIG. 13 is a simplified schematic structural diagram of a layout of another delay circuit unit according to an embodiment of the disclosure.
Figure 14:
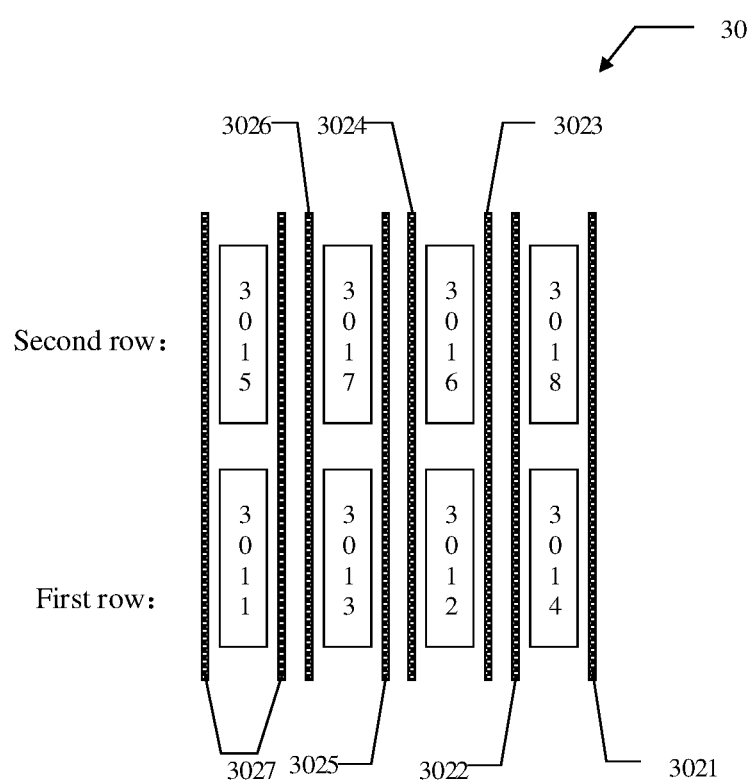
FIG. 14 is a simplified schematic structural diagram of a layout of yet another delay circuit unit according to an embodiment of the disclosure.

Referring to FIGS. 12 to 14, there is shown in FIG. 12 a schematic structural diagram of details of a layout 30 of yet another delay circuit unit according to an embodiment of the disclosure; FIG. 13 is a simplified schematic structural diagram of a layout 30 of another delay circuit unit according to an embodiment of the disclosure; FIG. 14 is a simplified schematic structural diagram of a layout 30 of yet another delay circuit unit according to an embodiment of the disclosure.

As shown in FIG. 12, after the first metal layer is connected to the second metal layer, the connection points 303A in the first metal layer are connected to the connection points 303A in the second metal layer correspondingly, thereby connecting the signal lines of the first metal layer to the signal lines of the second metal layer correspondingly.

Furthermore, the connection points 303A, 303B, 303D, etc. involved in the embodiments of the disclosure may take the same connection or different connection to achieve conductive connection and signal transmission between different signal lines. For example, the connection may be made by a contact plug, and a corresponding connection point may be a contact hole, so that two signal lines may be connected by the contact plug and the contact hole.

That is, the signal lines of the first metal layer are connected by the respective signal lines of the second metal layer, so that a target signal is transmitted to a corresponding NAND gate circuit. Here the target signal includes the foregoing first signal, second signal, third signal, fourth signal, fifth signal, and sixth signal.

In some embodiments, as shown in FIG. 13, the multiple layout units may include a first layout unit 3011, a second layout unit 3012, a third layout unit 3013, a fourth layout unit 3014, a fifth layout unit 3015, a sixth layout unit 3016, a seventh layout unit 3017, and an eighth layout unit 3018, and are arranged in a 2×4 array on the first metal layer.

Here, the fourth layout unit 3014, the second layout unit 3012, the third layout unit 3013, and the first layout unit 3011 are sequentially arranged in the first row of the array from right to left; here the fourth layout unit 3014 forms a fourth NAND gate circuit ND4, the second layout unit 3012 forms a second NAND gate circuit ND2, the third layout unit 3013 forms a third NAND gate circuit ND3, and the first layout unit 3011 forms a first NAND gate circuit ND1.

The eighth layout unit 3018, the sixth layout unit 3016, the seventh layout unit 3017, and the fifth layout unit 3015 are sequentially arranged in the second row of the array from right to left; here the eighth layout unit 3018 forms an eighth NAND gate circuit ND8, the sixth layout unit 3016 forms a sixth NAND gate circuit ND6, the seventh layout unit 3017 forms a seventh NAND gate circuit ND7, and the fifth layout unit 3015 forms a fifth NAND gate circuit ND5.

It is to be noted that as shown in FIG. 13, eight layout units may be formed in the layout 30 according to the embodiment of the disclosure, and the eight layout units are arranged in a 2×4 array in the first metal layer. Here the layout units 301 arranged in the first row in the first layout pattern include the fourth layout unit 3014, the second layout unit 3012, the third layout unit 3013, and the first layout unit 3011 from right to left; the layout units 302 arranged in the second row in the second layout pattern include the eighth layout unit 3018, the sixth layout unit 3016, the seventh layout unit 3017, and the fifth layout unit 3015 from right to left.

It is to be noted that referring to FIG. 2, the first layout unit 3011 forms the first NAND gate circuit ND1, the second layout unit 3012 forms the second NAND gate circuit ND2, the third layout unit 3013 forms the third NAND gate circuit ND3, the fourth layout unit 3014 forms the fourth NAND gate circuit ND4, the fifth layout unit 3015 forms the fifth NAND gate circuit ND5, the sixth layout unit 3016 forms the sixth NAND gate circuit ND6, the seventh layout unit 3017 forms the seventh NAND gate circuit ND7, and the eighth layout unit 3018 forms the eighth NAND gate circuit ND8.

Furthermore, in some embodiments, as shown in FIG. 14, redundant signal lines 3027 may be arranged on left and right sides of each of the first layout unit 3011 and the fifth layout unit 3015.

The sixth signal line 3026 and the fifth signal line 3025 may be sequentially arranged on left and right sides of each of the third layout unit 3013 and the seventh layout unit 3017.

The fourth signal line 3024 and the third signal line 3023 may be sequentially arranged on left and right sides of each of the second layout unit 3012 and the sixth layout unit 3016.

The second signal line 3022 and the first signal line 3021 may be sequentially arranged on left and right sides of each of the fourth layout unit 3014 and the eighth layout unit 3018.

The first layer metal lines in the first metal layer are distributed on both sides of each layout unit in a symmetrical structure, so that the layout is neatly arranged to facilitate consistent signal transmission.

In some embodiments, the multiple intermediate connection lines may be partitioned into a first set of intermediate connection lines and a second set of intermediate connection lines.

Here, the first set of intermediate connection lines, the first input interface signal line 6011, and the first output interface signal line 6012 are arranged at positions of the second metal layer corresponding to the fourth layout unit 3014, the second layout unit 3012, the third layout unit 3013, and the first layout unit 3011 respectively.

The second set of intermediate connection lines, the second input interface signal line 6021, the second output interface signal line 6022, the third input interface signal line 6031, and the third output interface signal line 6033 are arranged at positions of the second metal layer corresponding to the eighth layout unit 3018, the sixth layout unit 3016, the seventh layout unit 3017, and the fifth layout unit 3015 respectively.

It is to be noted that as shown in FIGS. 12 and 14, the first set of intermediate connection lines, the first input interface signal line 6011, and the first output interface signal line 6012 are arranged in the second metal layer at positions corresponding to the fourth layout unit 3014, the second layout unit 3012, the third layout unit 3013, and the first layout unit 3011 respectively; here the first set of intermediate connection lines may include a second signal transfer line 6041, a third signal transfer line I 6042, a fourth signal transfer line I 6043, a first NAND gate output signal transfer line 6044, and a sixth signal transfer line 6045.

In the first set of intermediate connection lines, the second signal transfer line 6041 transmits the second signal, and the third signal transfer line 6042 transmits the output signal of the fourth NAND gate circuit ND4, here the output signal of the fourth NAND gate circuit ND4 is the third signal; the fourth signal transfer line 6043 transmits the output signal of the third NAND gate circuit ND3, here the output signal of the third NAND gate circuit ND3 is the fourth signal; the first NAND gate output signal transfer line 6044 transmits the output signal of the first NAND gate circuit ND1, and the sixth signal transfer line 6045 transmits the sixth signal.

It is also to be noted that as shown in FIG. 12, the third signal transmitted by the third signal line 3023 is the output signal of the fourth NAND gate circuit ND4, and the fourth signal line 3024 transmits the output signal of the third NAND gate circuit ND3, that is, the third signal line 3023 and the fourth signal line 3024 transmit signals generated by the NAND gate circuit formed inside the layout 30, rather than signals from the outside of the layout 30, therefore the third signal line 3023 and the fourth signal line 3024 are shorter in the figures, that is, do not need to be connected to external lines not shown in the figures.

It is also to be noted that as shown in FIG. 12, the second set of intermediate connection lines, the second input interface signal line 6021, the second output interface signal line 6022, the third input interface signal line 6031, and the third output interface signal line 6032 are arranged in the second metal layer at positions corresponding to the eighth layout unit 3018, the sixth layout unit 3016, the seventh layout unit 3017, and the fifth layout unit 3015, a second group of intermediate connection lines; here the second set of intermediate connection lines may include an eighth NAND gate output signal transfer line 6051, a third signal transfer line 6052, a sixth NAND gate output signal transfer line 6053, and a fourth signal transfer line 6054.

In the second set of intermediate connection lines, the eighth NAND gate output signal transfer line 6051 transmits the output signal of the eighth NAND gate circuit ND8; the third signal transfer line 6052 transmits the third signal transmitted by the third signal line 3023; the sixth NAND gate output signal transfer line 6053 transmits the output signal of the sixth NAND gate circuit ND6; and the fourth signal transfer line 6054 transmits the fourth signal transmitted by the fourth signal line 3024.

In this way, the signals of the first metal layer are transferred and transmitted by the first set of intermediate connection lines and the second set of intermediate connection lines.

It is also to be noted that the signal lines not specifically described in FIGS. 5 to 14 are other signal lines in the layout of the delay circuit unit, implementing other functions of the circuit, the specific functions thereof are the same as those usually understood by those skilled in the art, and will not be elaborated here.

In some embodiments, as shown in FIG. 12, the first set of intermediate connection lines may connect part of signal lines of the fourth layout unit 3014, the second layout unit 3012, the third layout unit 3013, and the first layout unit 3011 at the first metal layer.

The second set of intermediate connection lines may connect part of signal lines of the eighth layout unit 3018, the sixth layout unit 3016, the seventh layout unit 3017, and the fifth layout unit 3015 at the first metal layer.

It is to be noted that as shown in FIG. 12, the first set of intermediate connection lines may be connected to the layout units in a specific way as follows: two connection points of the second signal transfer line 6041 may be connected to the connection point of the second signal line 3022 and the connection point of the second input signal line of the second layout unit 3012 respectively, so that the second signal may enter the second NAND gate circuit ND2 through the second signal line 3022 and the second signal transfer line 6041; two connection points of the third signal transfer line 6042 are connected to the connection point of the output signal line of the fourth layout unit 3014 and the connection point of the third signal line 3023 respectively, so that the third signal may be transmitted through the third signal transfer line 6042 and the third signal line 3023; two connection points of the fourth signal transfer line 6043 are connected to the connection point of the output signal line of the third layout unit 3013 and the connection point of the fourth signal line 3024 respectively, so that the fourth signal may be transmitted through the fourth signal transfer line 6043 and the fourth signal line 3024; three connection points of the first NAND gate output signal transfer line 6044 are connected to the connection point of the output signal line of the first layout unit 3011, the connection point of the first input signal line of the third layout unit 3013, and the connection point of the first input signal line of the second layout unit 3012 respectively, thereby transmitting the output signal of the first NAND gate circuit ND1 to the third NAND gate circuit ND3 and the second NAND gate circuit ND2.

Here the output signal of the first NAND gate circuit ND1 may be the foregoing first NAND gate output signal NET12.

Furthermore, referring to FIG. 5, with respect to the first signal transmitted by the first signal line 3021 and the fifth signal transmitted by the fifth signal line 3025, the first signal is transmitted to the second input signal line of the fourth layout unit 3014, and the second input signal line of the fourth layout unit 3014 is adjacent to the first signal line 3021 in the first metal layer; therefore, for the sake of simplicity and convenience of routing, a first adjacent signal line 3031 extending along the second direction may be provided at the first metal layer at this time, and the first signal line 3021 and the second input signal line of the fourth layout unit 3014 are connected through the first adjacent signal line 3031, thereby transmitting the first signal to the fourth NAND gate circuit ND4.

Similarly, the fifth signal is transmitted to the second input signal line of the third layout unit 3013, and the second input signal line of the third layout unit 3013 is adjacent to the fifth signal line 3025 in the first metal layer; therefore, for the sake of simplicity and convenience of routing, a second adjacent signal line 3032 extending along the second direction may be provided at the first metal layer at this time, and the fifth signal line 3025 and the second input signal line of the third layout unit 3013 are connected through the second adjacent signal line 3032, thereby transmitting the fifth signal to the third NAND gate circuit ND3.

That is, with respect to signal transmission between two adjacent signal lines in the first metal layer, it is not necessary to perform connection and transmission through intermediate connection lines in the second metal layer, instead it may be achieved by directly providing adjacent connection lines in the first metal layer. In this way, not only the whole layout of lines may be made simple and convenient, easy to process, but also crosstalk between lines may be avoided.

It is also to be noted that as shown in FIG. 12, the second set of intermediate connection lines may be connected to the layout units in a specific way as follows: two connection points of the eighth NAND gate output signal transfer line 6051 are connected to the connection point of the output signal line of the eighth layout unit 3018 and the connection point of the first input signal line of the seventh layout unit 3017 respectively, to transmit the output signal of the eighth NAND gate circuit ND8 to the seventh NAND gate circuit ND7; two connection points of the third signal transfer line 6052 are connected to the connection point of the third signal line 3023 and the second signal output terminal of the sixth layout unit 3016 respectively, so that the third signal is transmitted to the sixth NAND gate circuit ND6 through the third signal line 3023 and the third signal transfer line 6052; two connection points of the sixth NAND gate output signal transfer line 6053 are connected to the connection point of the output signal line of the sixth layout unit 3016 and the connection point of the second output signal line of the fifth layout unit 3015 respectively, thereby transmitting the output signal of the sixth NAND gate circuit ND6 to the fifth NAND gate circuit ND5; two connection points of the fourth signal transfer line 6054 are connected to the connection point of the fourth signal line 3024 and the second input signal line of the seventh layout unit 3017 respectively, so that the fourth signal is transmitted to the seventh NAND gate circuit ND7 through the fourth signal line 3024 and the fourth signal transfer line 6054.

Here the output signal of the eighth NAND gate circuit ND8 may be the foregoing eighth NAND gate output signal NET78, and the output signal of the sixth NAND gate circuit ND6 may be the foregoing sixth NAND gate output signal NET56.

In this way, the signal lines of the first metal layer and the second metal layer are connected correspondingly based on the connection points, thereby achieving signal transmission.

That is, with respect to the NAND gate circuit formed by each of the layout units of the layout 30, as shown in FIG. 12, the first layout unit 3011 has a first input signal line receiving the first input interface signal (INF signal) transmitted by the first input interface signal line 6011; a second input signal line receiving the sixth signal transmitted through the sixth signal line 3026 and the sixth signal transfer line 6045; and an output signal line outputting the output signal of the first NAND gate circuit ND1.

The third layout unit 3013 has a first input signal line receiving the output signal of the first NAND gate circuit ND1 transmitted through the first NAND gate output signal transfer line 6044; a second input signal line receiving the fifth signal transmitted through the fifth signal line 3025 and the second adjacent signal line 3032; and an output signal line outputting the fourth signal, and the second adjacent signal line 3032 is arranged on the first metal layer.

The second layout unit 3012 has a first input signal line receiving the output signal of the first NAND gate circuit ND1 transmitted through the first NAND gate output signal transfer line 6044; a second input signal line receiving the second signal transmitted through the second signal line 3022 and the second signal transfer line 6041; and an output signal line outputting the first output interface signal (OUTF signal).

The fourth layout unit 3014 has a first input signal line receiving the first output interface signal (OUTF signal) transmitted through the first output interface signal line 6012 and being the output signal of the second NAND gate circuit ND2; a second input signal line receiving the first signal transmitted through the first signal line 3021 and the first adjacent signal line 3031; and an output signal line outputting the third signal, here the first adjacent signal line 3031 is arranged on the first metal layer.

The eighth layout unit 3018 has a first input signal line receiving the third input interface signal (INE signal) transmitted through the third input interface signal line 6031; a second input signal line connected to the power supply terminal vdd to receive the power supply signal (vdd signal); and an output signal line outputting the output signal of the eighth NAND gate circuit ND8.

The sixth layout unit 3016 has a first input signal line receiving the second input interface signal (INE signal) transmitted through the second input interface signal line 6021; a second input signal line receiving the third signal transmitted through the third signal transfer line 6042, the third signal line and the third signal transfer line 6052; and an output signal line outputting the output signal of the sixth NAND gate circuit ND6.

The seventh layout unit 3017 has a first input signal line receiving the output signal of the eighth NAND gate circuit ND8 transmitted by the eighth NAND gate output signal transfer line 6051; a second input signal line receiving the fourth signal transmitted through the fourth signal transfer line 6043, the fourth signal line 3024 and the fourth signal transfer line 6054; and an output signal line outputting the first output interface signal (OUTE signal).

The fifth layout unit 3015 has a first input signal line receiving the sixth NAND gate output signal transmitted through the sixth NAND gate output signal transfer line 6053; a second input signal line connected to the power supply terminal vdd to receive the power supply signal (vdd signal); and an output signal line outputting the third output interface signal (OUTO signal).

In this way, the first metal layer and the second metal layer are connected by the signal lines of the first metal layer and the second metal layer, so that the input signal may be transmitted to the first input signal line or the second input signal line of the NAND gate circuit of the delay circuit unit, and the output signal of the NAND gate circuit may be transmitted to other NAND gate circuits or output directly. The whole layout of lines is compact, highly integrated, and simple and easy to process.

An embodiment of the disclosure provides a layout of a delay circuit unit, the layout includes multiple layout units arranged in an array and each forming a NAND gate circuit; here several layout units conforming to a first layout pattern are sequentially arranged in a first row of the array; and several layout units conforming to a second layout pattern are sequentially arranged in a second row of the array; here the first layout pattern is different from the second layout pattern, and the first layout pattern and the second layout pattern are such that the first row and the second row form a center-symmetrical structure. In this way, not only it is advantageous to achieve delay consistency between different phase signals, but also the layout of the delay circuit unit is compactly arranged as a whole, so that an area of the layout may also be saved.

Figure 15:
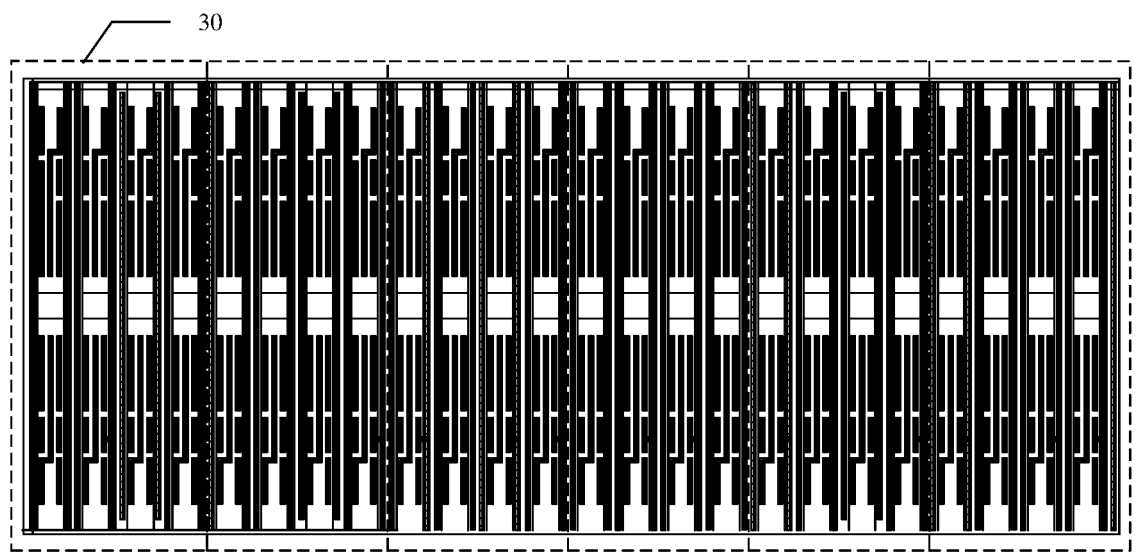
FIG. 15 is a schematic structural diagram of a layout of a delay circuit according to an embodiment of the disclosure.

In another embodiment of the disclosure, referring to FIG. 15, there is shown a schematic structural diagram of a layout of a delay circuit according to an embodiment of the disclosure, the delay circuit may include the foregoing first metal layer and second metal layer, and FIG. 15 is a schematic diagram of the whole arrangement of the first metal layer. The delay circuit includes N delay circuit units each corresponding to the layout 30 described in the foregoing embodiments. As shown in FIG. 15, the layout of the delay circuit includes multiple foregoing layouts 30 of the delay circuit units. Here N is an integer greater than zero.

Here the delay circuit may be a DLL circuit for example.

In some embodiments, the layout of the delay circuit may be formed by cascading layouts of the N delay circuit units.

A first input interface signal input into a first layout is a first output interface signal output from a second layout.

A second input interface signal input into the second layout is a second output interface signal output from the first layout.

A third input interface signal input into the second layout is a third output interface signal output from the first layout.

Here, the first layout and the second layout represent layouts of two adjacent delay circuit units in the layout of the delay circuit.

Figure 16:
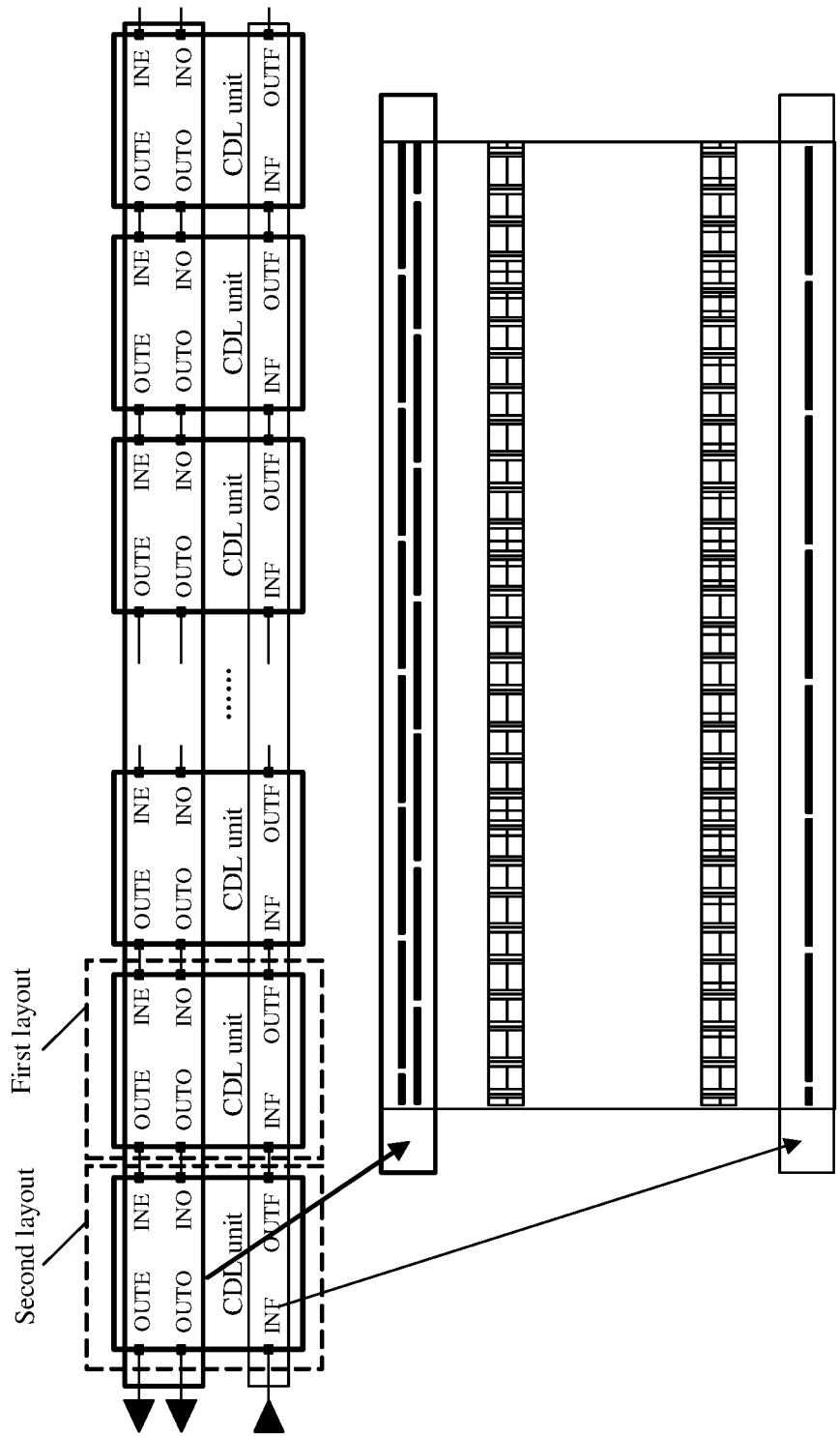
FIG. 16 is a schematic structural diagram of a layout of another delay circuit according to an embodiment of the disclosure.

It is to be noted that referring to FIG. 16, there is shown a schematic structural diagram of a layout of another delay circuit according to an embodiment of the disclosure, it is a schematic diagram of the whole arrangement of the second metal layer. As shown in FIG. 16, with respect to the delay circuit, the first input interface signal (INF signal), the first output interface signal (OUTF signal), the second input interface signal (INE signal), the second output interface signal (OUTE signal), the third input interface signal (INO signal), and the third output interface signal (OUTO signal) of each delay circuit unit (CDL unit) are input and output through the second layer signal lines, and each CDL unit maintains the same signal line layout and spacing, thereby achieving signal delay consistency.

It is also to be noted that as shown in FIG. 16, there is provided an example where the first CDL unit from the left is the second layout, and the second CDL unit from the left is the first layout; the first input interface signal (INF signal) input into the first layout is the first output interface signal (OUTF signal) output from the second layout; the second input interface signal (INE signal) input into the second layout is the second output interface signal (OUTE signal) output from the first layout; and the third input interface signal (INO signal) input into the second layout is the third output interface signal (OUTO signal) output from the first layout; by way of such signal transmission, the layouts 30 of the N delay circuit units are cascaded to form the layout of the delay circuit.

Since the layout of the delay circuit is formed by cascading N layouts 30, not only delay consistency of signal transmission within the layout 30 may be achieved, but also delay consistency between the N layouts 30 may be achieved, so that lengths of all the signal on the whole delay chain are consistent in the layout.

Figure 17:
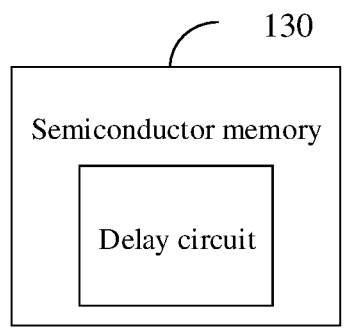
FIG. 17 is a schematic structural diagram of a composition of a semiconductor memory according to an embodiment of the disclosure.

In yet another embodiment of the disclosure, referring to FIG. 17, there is shown a schematic structural diagram of a composition of a semiconductor memory 130 according to an embodiment of the disclosure. As shown in FIG. 17, the semiconductor memory 130 includes a delay circuit corresponding to the layout of the delay circuit described in any one of the foregoing embodiments.

Here the semiconductor memory may include a Dynamic Random Access Memory (DRAM), a Static Random-Access Memory (SRAM), a Magnetic Random Access Memory (MRAM), or the like, which is not specifically limited in the embodiment of the disclosure. Embodiments of the disclosure are not specifically limited thereto. With respect to the semiconductor memory 130, since the semiconductor memory may include the delay circuit corresponding to the foregoing layout of the delay circuit, not only delay consistency of signal transmission within the layout of the delay circuit unit may be achieved, but also delay consistency between the layouts of the N delay circuit units may be achieved.

The above descriptions are merely preferred embodiments of the disclosure and are not intended to limit the scope of protection of the disclosure.

According to a layout of a delay circuit unit, a layout of a delay circuit, and a semiconductor memory provided in the embodiments of the disclosure, the layout of the delay circuit unit includes multiple layout units arranged in an array and each forming a NAND gate circuit; here several layout units conforming to a first layout pattern are sequentially arranged in a first row of the array; and several layout units conforming to a second layout pattern are sequentially arranged in a second row of the array; here the first layout pattern is different from the second layout pattern, and the first layout pattern and the second layout pattern are such that the first row and the second row form a center-symmetrical structure. In this way, multiple layout units in the layout are arranged in an array, not only it is advantageous to achieve delay consistency between different phase signals, but also the layout of the delay circuit unit is compactly arranged as a whole, so that an area of the layout may also be saved.

It is to be noted that in the disclosure, the terms "include", "including" or any other variation thereof are intended to cover non-exclusive inclusion, such that a process, method, article, or device including a series of elements includes not only those elements but also other elements that are not listed explicitly, or elements inherent to such process, method, article, or device. Without any more limitation, a element defined by a sentence "include a" does not exclude other identical elements also existing in a process, method, article, or device including the element.

The above numbers for embodiments of the disclosure are for the purpose of description only and do not represent pros and cons of the embodiments.

The methods disclosed in several method embodiments provided by the disclosure may be combined arbitrarily without conflict, to obtain new method embodiments.

The features disclosed in several product embodiments provided by the disclosure may be combined arbitrarily without conflict, to obtain new product embodiments.

The features disclosed in several method or device embodiments provided by the disclosure may be combined arbitrarily without conflict, to obtain new method or device embodiments.

The above descriptions are merely specific embodiments of the disclosure, but the scope of protection of the disclosure is not limited thereto, and variation or replacement readily conceivable by any person skilled in the art within the technical scope of the disclosure shall be covered within the scope of protection of the disclosure. Therefore, the scope of protection of the disclosure is subjected to the scope of protection of the claims.

The invention claimed is:

1. A layout of a delay circuit unit, comprising a plurality of layout units each of which forms a NOT-AND (NAND) gate circuit, the plurality of layout units being arranged in an array, wherein
   at least two of the plurality of layout units conforming to a first layout pattern are sequentially arranged in a first row of the array; and
   at least two of the plurality of layout units conforming to a second layout pattern are sequentially arranged in a second row of the array,
   wherein the first layout pattern is different from the second layout pattern, and the first layout pattern and the second layout pattern are such that the first row and the second row form a center-symmetrical structure; and
   each of the plurality of layout units comprises at least a first input signal line, a second input signal line, and an output signal line, wherein
      according to the first layout pattern, signal lines of each layout unit are arranged in a sequence of the second input signal line, the output signal line, and the first input signal line from right to left; and
      according to the second layout pattern, signal lines of each layout unit are arranged in a sequence of the first input signal line, the output signal line, and the second input signal line from right to left.

2. The layout of claim 1, wherein the layout is partitioned into at least a first metal layer and a second metal layer, the second metal layer is located above the first metal layer, wherein
   the first metal layer is provided for arranging the first input signal line, the second input signal line, the output signal line, and first layer signal lines; and
   the second metal layer is provided for arranging second layer signal lines; and
   wherein each of the first input signal line, the second input signal line, the output signal line, and the first layer signal lines is routed along a first direction, each of the second layer signal lines is routed along a second direction, and the first direction and the second direction form an included angle of 90 degrees.

3. The layout of claim 2, wherein
   the first layer signal lines comprise at least a first signal line, a second signal line, a third signal line, a fourth signal line, a fifth signal line, and a sixth signal line; and
   the second layer signal lines comprise at least a first input interface signal line, a first output interface signal line, a second input interface signal line, a second output interface signal line, a third input interface signal line, and a third output interface signal line.

4. The layout of claim 3, wherein the first layer signal lines are arranged on both sides of each of the plurality of layout units, wherein
   the first layer signal lines are arranged in a sequence of the first signal line, the second signal line, the third signal line, the fourth signal line, the fifth signal line, and the sixth signal line from right to left.

5. The layout of claim 4, wherein the first layer signal lines further comprise a plurality of redundant signal lines, wherein
   the first layer signal lines are arranged in a sequence of the first signal line, the second signal line, the third signal line, the fourth signal line, the fifth signal line, the sixth signal line, and the plurality of redundant signal lines from right to left.

6. The layout of claim 3, wherein a plurality of the first layer signal lines in the first metal layer have a same width and a same spacing between two adjacent signal lines.

7. The layout of claim 3, wherein the second layer signal lines further comprise a plurality of intermediate connection lines, each of the plurality of intermediate connection lines is provided with a connection point, wherein
   the plurality of intermediate connection lines are used to connect signal lines provided with connection points in the first metal layer, to transmit a target signal to a corresponding NAND gate circuit.

8. The layout of claim 7, wherein the plurality of layout units comprise a first layout unit, a second layout unit, a third layout unit, a fourth layout unit, a fifth layout unit, a sixth layout unit, a seventh layout unit, and an eighth layout unit, and are arranged in a 2×4 array on the first metal layer, wherein
   the fourth layout unit, the second layout unit, the third layout unit, and the first layout unit are sequentially arranged in the first row of the array from right to left; wherein the fourth layout unit forms a fourth NAND gate circuit, the second layout unit forms a second NAND gate circuit, the third layout unit forms a third NAND gate circuit, and the first layout unit forms a first NAND gate circuit; and
   the eighth layout unit, the sixth layout unit, the seventh layout unit, and the fifth layout unit are sequentially arranged in the second row of the array from right to left; wherein the eighth layout unit forms an eighth NAND gate circuit, the sixth layout unit forms a sixth NAND gate circuit, the seventh layout unit forms a seventh NAND gate circuit, and the fifth layout unit forms a fifth NAND gate circuit.

9. The layout of claim 8, wherein
   redundant signal lines are arranged on left and right sides of each of the first layout unit and the fifth layout unit;
   the sixth signal line and the fifth signal line are sequentially arranged on left and right sides of each of the third layout unit and the seventh layout unit;
   the fourth signal line and the third signal line are sequentially arranged on left and right sides of each of the second layout unit and the sixth layout unit; and
   the second signal line and the first signal line are sequentially arranged on left and right sides of each of the fourth layout unit and the eighth layout unit.

10. The layout of claim 9, wherein the plurality of intermediate connection lines are partitioned into a first set of intermediate connection lines and a second set of intermediate connection lines, wherein
   the first set of intermediate connection lines, the first input interface signal line, and the first output interface signal line are arranged at positions of the second metal layer corresponding to the fourth layout unit, the second layout unit, the third layout unit, and the first layout unit respectively; and the second set of intermediate connection lines, the second input interface signal line, the second output interface signal line, the third input interface signal line, and the third output interface signal line are arranged at positions of the second metal layer corresponding to the eighth layout unit, the sixth layout unit, the seventh layout unit, and the fifth layout unit respectively.

11. The layout of claim 10, wherein
the first set of intermediate connection lines connects part of signal lines of the fourth layout unit, the second layout unit, the third layout unit, and the first layout unit at the first metal layer; and
the second set of intermediate connection lines connects part of signal lines of the eighth layout unit, the sixth layout unit, the seventh layout unit, and the fifth layout unit at the first metal layer.

12. The layout of claim 2, wherein the NAND gate circuit comprises a first P-type channel Metal Oxide Semiconductor (PMOS) transistor, a second PMOS transistor, a first N-type channel Metal Oxide Semiconductor (NMOS) transistor, and a second NMOS transistor; the second metal layer further comprises a power supply line and a ground line, wherein
the power supply line is connected to a source of the first PMOS transistor and a source of the second PMOS transistor respectively;
the ground line is connected to a source of the first NMOS transistor;
the first input signal line is connected to a gate of the second PMOS transistor and a gate of the second NMOS transistor respectively;
the second input signal line is connected to a gate of the first PMOS transistor and a gate of the first NMOS transistor respectively; and
the output signal line is connected to a drain of the first PMOS transistor, a drain of the second PMOS transistor, and a drain of the second NMOS transistor respectively.

13. A layout of a delay circuit, wherein the delay circuit comprises N delay circuit units, N is an integer greater than zero, each of the N delay circuit units comprises a plurality of layout units each of which forms a NOT-AND (NAND) gate circuit, the plurality of layout units being arranged in an array, wherein
at least two of the plurality of layout units conforming to a first layout pattern are sequentially arranged in a first row of the array; and
at least two of the plurality of layout units conforming to a second layout pattern are sequentially arranged in a second row of the array,
wherein the first layout pattern is different from the second layout pattern, and the first layout pattern and the second layout pattern are such that the first row and the second row form a center-symmetrical structure; and
each of the plurality of layout units comprises at least a first input signal line, a second input signal line, and an output signal line, wherein
according to the first layout pattern, signal lines of each layout unit are arranged in a sequence of the second input signal line, the output signal line, and the first input signal line from right to left; and
according to the second layout pattern, signal lines of each layout unit are arranged in a sequence of the first input signal line, the output signal line, and the second input signal line from right to left.

14. The layout of claim 13, wherein the layout of the delay circuit is formed by cascading layouts of the N delay circuit units, wherein
a first input interface signal input into a first layout is a first output interface signal output from a second layout;
a second input interface signal input into the second layout is a second output interface signal output from the first layout; and
a third input interface signal input into the second layout is a third output interface signal output from the first layout; and
wherein the first layout and the second layout represent layouts of two adjacent delay circuit units of the N delay circuit units in the layout of the delay circuit.

15. The layout of claim 13, wherein the layout is partitioned into at least a first metal layer and a second metal layer, the second metal layer is located above the first metal layer, wherein
the first metal layer is provided for arranging the first input signal line, the second input signal line, the output signal line, and first layer signal lines; and
the second metal layer is provided for arranging second layer signal lines; and
wherein each of the first input signal line, the second input signal line, the output signal line, and the first layer signal lines is routed along a first direction, each of the second layer signal lines is routed along a second direction, and the first direction and the second direction form an included angle of 90 degrees.

16. The layout of claim 15, wherein
the first layer signal lines comprise at least a first signal line, a second signal line, a third signal line, a fourth signal line, a fifth signal line, and a sixth signal line; and
the second layer signal lines comprise at least a first input interface signal line, a first output interface signal line, a second input interface signal line, a second output interface signal line, a third input interface signal line, and a third output interface signal line.

17. The layout of claim 16, wherein the first layer signal lines are arranged on both sides of each of the plurality of layout units, wherein
the first layer signal lines are arranged in a sequence of the first signal line, the second signal line, the third signal line, the fourth signal line, the fifth signal line, and the sixth signal line from right to left.

18. A semiconductor memory, comprising a delay circuit, wherein the delay circuit comprises N delay circuit units, N is an integer greater than zero, each of the N delay circuit units comprises a plurality of layout units each of which forms a NOT-AND (NAND) gate circuit, the plurality of layout units being arranged in an array, wherein
at least two of the plurality of layout units conforming to a first layout pattern are sequentially arranged in a first row of the array; and
at least two of the plurality of layout units conforming to a second layout pattern are sequentially arranged in a second row of the array,
wherein the first layout pattern is different from the second layout pattern, and the first layout pattern and the second layout pattern are such that the first row and the second row form a center-symmetrical structure; and
each of the plurality of layout units comprises at least a first input signal line, a second input signal line, and an output signal line, wherein according to the first layout pattern, signal lines of each layout unit are arranged in a sequence of the second input signal line, the output signal line, and the first input signal line from right to left; and according to the second layout pattern, signal lines of each layout unit are arranged in a sequence of the first input signal line, the output signal line, and the second input signal line from right to left.

\* \* \* \* \*